United States Patent
Ito

(10) Patent No.: US 7,995,414 B2
(45) Date of Patent: Aug. 9, 2011

(54) SEMICONDUCTOR MEMORY DEVICE, METHOD OF OPERATING SEMICONDUCTOR MEMORY DEVICE, AND MEMORY SYSTEM

(75) Inventor: Shigemasa Ito, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 99 days.

(21) Appl. No.: 12/410,940

(22) Filed: Mar. 25, 2009

(65) Prior Publication Data

US 2009/0245003 A1 Oct. 1, 2009

(30) Foreign Application Priority Data

Mar. 27, 2008 (JP) ................. 2008-084089

(51) Int. Cl.
*G11C 7/04* (2006.01)
*G11C 7/00* (2006.01)
(52) U.S. Cl. ................. 365/211; 365/189.011
(58) Field of Classification Search .......... None
See application file for complete search history.

(56) References Cited

U.S. PATENT DOCUMENTS

| 7,257,028 B2 * | 8/2007 | Lee et al. ............... 365/185.18 |
| 2007/0091703 A1 | 4/2007 | Nishimura et al. |
| 2008/0001615 A1 * | 1/2008 | Lim et al. ................. 324/760 |
| 2008/0037338 A1 * | 2/2008 | Chen et al. ............. 365/194 |

FOREIGN PATENT DOCUMENTS

| JP | 02-146178 A | 6/1990 |
| JP | 2002-313099 A | 10/2002 |
| WO | WO 2005/124786 A1 | 12/2005 |

* cited by examiner

*Primary Examiner* — Hoai V Ho
*Assistant Examiner* — James G Norman
(74) *Attorney, Agent, or Firm* — Arent Fox LLP

(57) ABSTRACT

A semiconductor memory device is provided which comprises: a sense amplifier; and a bit line, wherein the disconnection of the sense amplifier from the bit line is performed in a data read operation when temperature in the semiconductor memory device is at a first temperature, and wherein the disconnection of the sense amplifier from the bit line is not performed in the data read operation when the temperature in the semiconductor memory device is at a second temperature.

20 Claims, 32 Drawing Sheets

SEMICONDUCTOR MEMORY DEVICE, METHOD OF OPERATING SEMICONDUCTOR MEMORY DEVICE, AND MEMORY SYSTEM

CROSS-REFERENCE TO RELATED APPLICATIONS

This application claims the benefit of priority from Japanese Patent Application No. 2008-84089 filed on Mar. 27, 2008, the entire contents of which are incorporated herein by reference.

BACKGROUND

1. Field

The application relates to a semiconductor memory device that includes a sense amplifier.

2. Description of the Related Art

As a semiconductor device becomes smaller, the wiring pitch of bit lines is reduced, and the coupling capacitance increases. For example, in a read operation, when a read data signal on a bit line changes due to coupling noise associated with the adjacent bit line, the data signal may be corrupted. A method of preventing noise in a bit line by temporarily turning off a switch that couples a sense amplifier with the bit line is, for example, described in Japanese Laid-open Patent Publication No. 2002-313099. Other related art is, for example, described in Japanese Laid-open Patent Publication No. H2-146178 and WO2005-124786.

However, in a read operation, when the switch that couples the sense amplifier to the bit line is temporarily turned off, the timing at which a data signal on the bit line is amplified by the sense amplifier is delayed, thereby causing long access time.

SUMMARY

According to some aspects of embodiments of the present invention, a semiconductor memory device is provided which comprises: a sense amplifier; and a bit line, wherein disconnection of the sense amplifier from the bit line is performed in a data read operation when the temperature in the semiconductor memory device is at a first temperature, and wherein the disconnection of the sense amplifier from the bit line is not performed in the data read operation when the temperature in the semiconductor memory device is at a second temperature.

Additional advantages and novel features of the invention will be set forth in part in the description that follows, and in part will become more apparent to those skilled in the art upon examination of the following or upon learning by practice of the invention.

DESCRIPTION OF PREFERRED EMBODIMENTS

In the figures, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicates a positive logic. A signal having a reference symbol prefixed with a symbol "/" and a signal having a reference symbol suffixed with a letter "X" indicate a negative logic. A double-square symbol represents an external terminal such as a pad on a semiconductor chip or a lead of a package containing the semiconductor chip therein. Terminals and signals supplied through the terminals, respectively, are denoted by like reference symbols.

Figure 1:
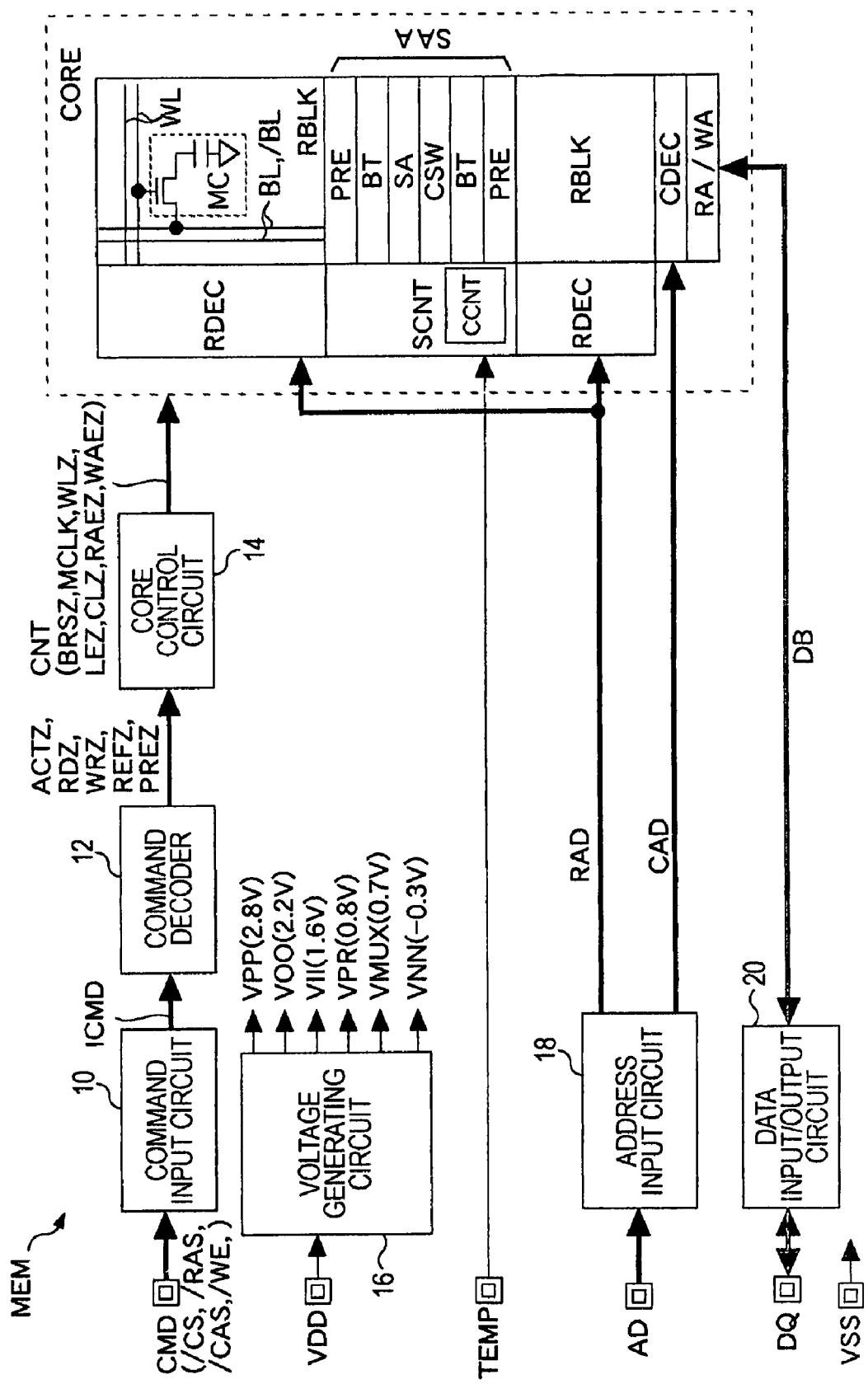
FIG. 1 illustrates a first embodiment.

FIG. 1 illustrates a first embodiment. A semiconductor memory MEM is, for example, a dynamic random access memory (DRAM). The memory MEM may be a semiconductor memory device enclosed in a package or may be a memory macro (IP) mounted on a system LSI, or the like. The memory MEM may be a clock-asynchronous-type memory in accordance with some aspects. In other aspects, the memory MEM may be a clock-synchronous-type memory instead.

The memory MEM includes a command input circuit 10, a command decoder 12, a core control circuit 14, a voltage generating circuit 16, an address input circuit 18, a data input/output circuit 20 and a memory core CORE. Though not shown in the drawing, the DRAM includes a refresh request generating circuit, a refresh address counter, and the like, in order to periodically execute a refresh operation in a self-refresh mode. The refresh request generating circuit periodically generates an internal refresh request. The refresh address counter generates a refresh address signal that indicates a memory cell to be refreshed.

The command input circuit 10 receives a command signal CMD, and outputs the received command signal CMD as an internal command signal ICMD. For example, the command signal CMD may be a chip select signal /CS, a row address strobe signal /RAS, a column address strobe signal /CAS and a write enable signal /WE.

The command decoder 12 decodes the internal command signal ICMD, and outputs an active command signal ACTZ (active command), a read command signal RDZ (read command), a write command signal WRZ (write command), a refresh command signal REFZ (refresh command), or a pre-charge command signal PREZ (pre-charge command) in order to execute an access operation of the memory core CORE.

The core control circuit 14 outputs a control signal CNT that controls the access operation of the memory core CORE, such as the read operation, the write operation or the refresh operation in response to the active command signal ACTZ, the read command signal RDZ, the write command signal WRZ, the refresh command signal REFZ or the pre-charge command signal PREZ. The control signal CNT includes a pre-charge control signal BRSZ for pre-charging bit lines BL and /BL, a bit control signal MCLK for controlling a connection switch BT, a word control signal WLZ for activating a word line WL, a sense amplifier control signal LEZ for activating a sense amplifier SA, a column control signal CLZ for turning on a column switch CSW, a read amplifier control signal RAEZ for activating a read amplifier RA, a write amplifier control signal WAEZ for activating a write amplifier WA, and the like.

The control signals BRSZ, MCLK, WLZ and LEZ are activated in synchronization with the active command signal ACTZ and are de-activated in synchronization with the pre-charge command signal PREZ. The column control signal CLZ is activated for a given period in synchronization with the read command signal RDZ, the write command signal WRZ and the refresh command signal REFZ. The read amplifier control signal RAEZ is activated for a given period in synchronization with the read command signal RDZ. The write amplifier control signal WAEZ is activated for a given period in synchronization with the write command signal WRZ.

The active command causes the word line WL selected by the row address signal RAD to be activated. The read command causes data to be read from the memory cell MC selected by the row address signal RAD and the column address signal CAD. The write command causes data to be written to the memory cell MC selected by the row address signal RAD and the column address signal CAD. The refresh command causes the memory cell MC, coupled to the word line WL that is selected by the refresh address signal, to be refreshed.

The voltage generating circuit 16 receives a power supply voltage VDD (for example, 1.8 V), and generates an internal power supply voltage VPP, VOO, VII, VPR, VMUX or VNN. The internal power supply voltages VPP, VOO, VII, VPR, VMUX and VNN have constant voltages that are independent from variations in power supply voltage VDD.

Figure 2:
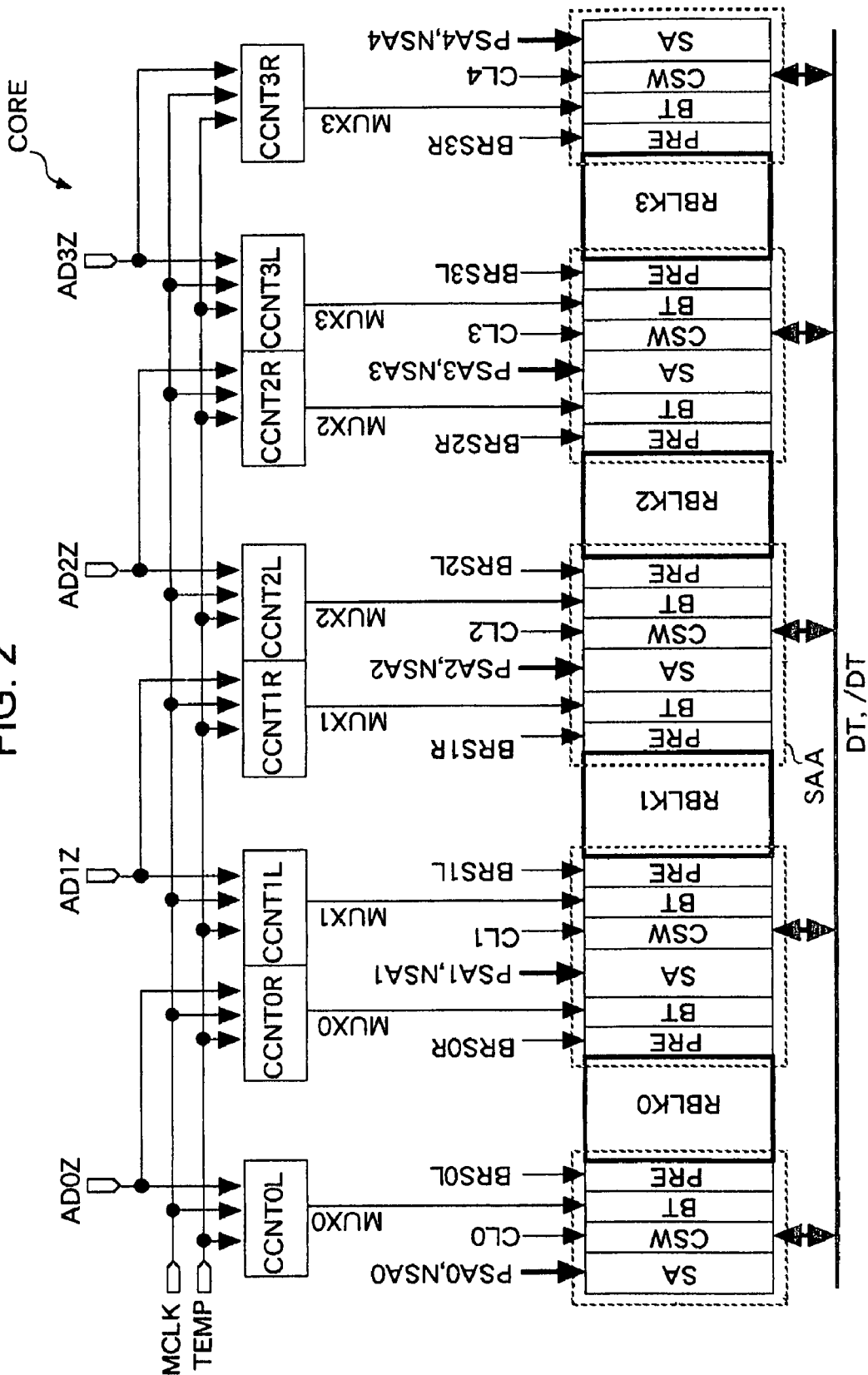
FIG. 2 illustrates an exemplary memory core.

The voltage VPP, for example, a boosting voltage of 2.8 V, is a high-level voltage of the word line WL or a first high-level voltage of a switch control signal MUX for controlling the connection switch BT illustrated in FIG. 2. The voltage VOO, for example, 2.2 V, is a second high-level voltage of the switch control signal MUX. The first high-level voltage (VPP) turns on the connection switch BT when the memory cell MC is accessed. The second high-level voltage (VOO) turns on the connection switch BT when the memory cell MC is not accessed.

The voltage VII, for example, 1.6 V, is supplied to an internal circuit as an internal power supply voltage. For example, the internal circuit includes the command decoder 12, the core control circuit 14 and the memory core CORE. The voltage VPR, for example, 0.8 V, may be a pre-charge voltage of the bit lines BL and /BL. The voltage VMUX, for example, 0.7 V, may be a low-level voltage of the switch control signal MUX for temporarily turning off the connection switch BT when the memory cell MC is accessed. The voltage VNN, for example, negative voltage −0.3 V, may be a low-level voltage of the word line WL.

The address input circuit 18 receives the row address signal RAD and the column address signal CAD, which are supplied to an address terminal AD, in a time sharing manner in order to select the memory cell MC to be accessed. The row address signal RAD is supplied in synchronization with the row address strobe signal /RAS in order to select the word line WL. The column address signal CAD is supplied in synchronization with the column address strobe signal /CAS in order to select the pair of bit lines BL and /BL.

The data input/output circuit 20 outputs read data from the memory cell MC to a data terminal DQ through a complementary data bus DB during a read operation. The data terminal DQ is, for example, 16 bits. The data input/output circuit 20 outputs a write data signal, supplied to the data terminal DQ, to the data bus DB during a write operation.

The memory core CORE includes a plurality of memory blocks RBLK, row decoders RDEC corresponding to the respective memory blocks RBLK, a sense amplifier area SAA arranged between the adjacent memory blocks RBLK, a switch control portion SCNT arranged between the adjacent row decoders RDEC, a column decoder CDEC, a read amplifier RA and a write amplifier WA.

Each memory block RBLK includes a plurality of dynamic memory cells MC arranged in a matrix, a plurality of the word lines WL, each of which is coupled to the memory cells MC arranged horizontally in the drawing, and a plurality of pairs of bit lines BL and /BL, each pair of which is coupled to the memory cells MC arranged vertically in the drawing. Each memory cell MC includes a capacitor for holding data as an electric charge and a transfer transistor for coupling one end of the capacitor to the bit line BL (or /BL). The other end of the capacitor is coupled to a reference voltage line.

The sense amplifier area SAA includes a pre-charge circuit PRE and a connection switch BT corresponding to each memory block RBLK, and a sense amplifier SA and column switch CSW which are shared by the memory blocks RBLK. The connection switch BT selectively couples the pair of bit lines BL and /BL of each memory block RBLK to the sense amplifier SA.

The switch control portion SCNT generates control signals for controlling the pre-charge circuit PRE, the connection switch BT, the sense amplifier SA and the column switch CSW in response to the control signal CNT. The connection control circuit CCNT of the switch control portion SCNT operates when receiving a temperature signal TEMP supplied through an external terminal. The temperature signal TEMP is set to a low level when the temperature in the memory MEM is high, for example, higher than or equal to 60° C. The temperature signal TEMP is set to a high level when the temperature in the memory MEM is low, for example, lower than 60° C.

The row decoder RDEC decodes the row address signal RAD in order to select the word line WL. The column decoder CDEC decodes the column address signal CAD in order to select the pairs of bit lines BL and /BL corresponding to the number of bits of the data terminal DQ. The read amplifier RA amplifies complementary read data output through the column switch CSW during a read operation. The write amplifier WA amplifies complementary write data supplied through the data bus DB and supplies the amplified data to the pair of bit lines BL and /BL during a write operation.

FIG. 2 illustrates an exemplary memory core CORE illustrated in FIG. 1. The memory MEM includes four memory blocks RBLK0 to RBLK3. The switch control portion SCNT includes connection control circuits CCNT, CCNT0L, CCNT0R, CCNT1L, CCNT1R, CCNT2L, CCNT2R, CCNT3L and CCNT3R corresponding to the blocks of the respective connection switches BT of the sense amplifier areas SAA. The numerical suffix of each connection control circuit CCNT indicates a number of the corresponding memory block RBLK. The suffix "L" and "R" of each connection control circuit CCNT respectively indicate a left position and right position of the corresponding memory block RBLK.

The connection control circuits CCNT are selected by address decode signals ADZ (AD0Z to AD3Z). The address decode signals ADZ (AD0Z to AD3Z) each are generated based on two bits of the row address signal RAD (block selection address) for selecting the memory block RBLK0 to RBLK3. The address decode signals AD0Z to AD3Z may be generated in the respective connection control circuits CCNT or may be generated in the respective row decoders RDEC. The selected connection control circuit CCNT outputs the switch control signal MUX0 to MUX3 in accordance with the logic level of the temperature signal TEMP while the bit control signal MCLK is at a high level. The pair of connection control circuits CCNT having the same numerical suffix operate in the same or similar manner. Thus, within an allowable range of a load on a signal line, the switch control signal MUX output from one connection control circuit CCNT may be supplied to a pair of connection switches BT corresponding to one memory block RBLK. The connection control circuit CCNT connects or disconnects a line between the sense amplifier SA and the bit lines BL and /BL in accordance with the temperature of the memory MEM during a read operation.

In the sense amplifier areas SAA, the pre-charge circuit PRE, the connection switch BT, the column switch CSW and the sense amplifier SA are, for example, arranged on each side of each of the memory blocks RBLK0 to RBLK3. The sense amplifier SA arranged between the mutually adjacent pair of memory blocks RBLK, for example, RBLK0 and RBLK1, is shared by the pair of memory blocks RBLK. This sharing is called a shared sense amplifier method.

Each sense amplifier SA operates in synchronization with sense amplifier activation signals PSA and NSA (PSA0 to PSA4 and NSA0 to NSA4). The sense amplifier activation signals PSA and NSA synchronize with the sense amplifier control signal LEZ output from the core control circuit 14 shown in FIG. 1. Signal lines of the sense amplifier activation signals PSA and NSA are wired in every block of the sense amplifier SA. Each column switch CSW synchronizes with a corresponding one of the column switch signals CL0 to CL4 and coupled the complementary outputs of the sense amplifier SA to data lines DT and /DT. Each column switch signal CL synchronizes with the column control signal CLZ. A signal line for the column switch signal CL is wired in every group of the column switches CSW corresponding to the number of bits of the data terminal DQ. The data lines DT and /DT are coupled to the data bus DB through a switch circuit (not shown).

Each block of the connection switches BT operates in synchronization with the switch control signal MUX (MUX0 to MUX3). Signal lines for the switch control signals MUX0 to MUX3 are wired in every block of the connection switches BT. Each switch control signal MUX synchronizes with the bit control signal MCLK. Each pre-charge circuit PRE couples the bit lines BL and /BL to a pre-charge voltage line VPR in synchronization with the pre-charge control signal BRS (BRS0L to BRS3L, BRS0R to BRS3R). A signal line for the pre-charge control signal BRS is wired in every block of the pre-charge circuit PRE. The pre-charge control signal BRS synchronizes with the pre-charge control signal BRSZ.

Figure 3:
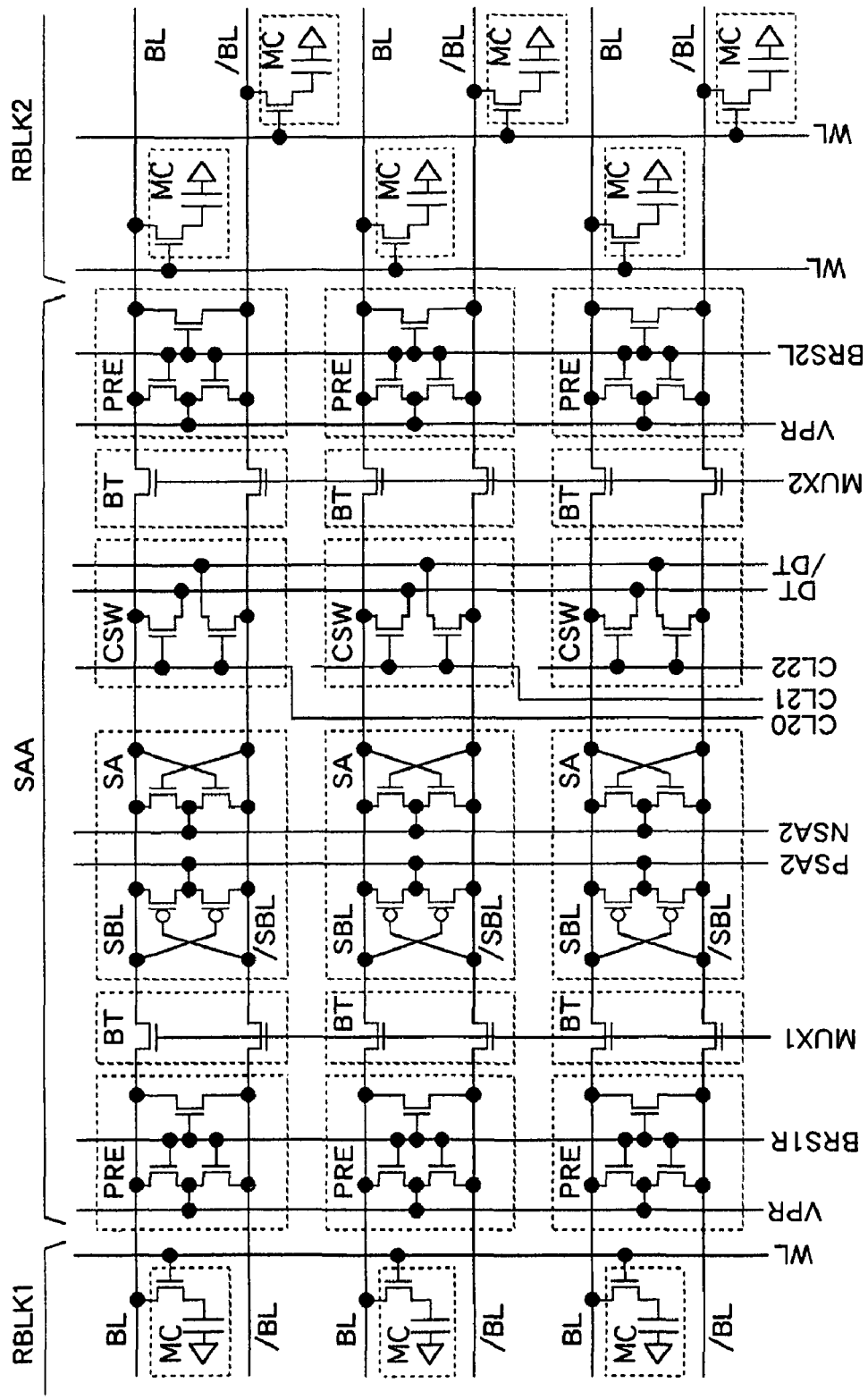
FIG. 3 illustrates an exemplary sense amplifier area.

FIG. 3 illustrates an exemplary sense amplifier area SAA that is arranged between the memory blocks RBLK1 and RBLK2. For example, FIG. 3 illustrates portion of the sense amplifier area SAA that corresponds to one data terminal DQ. When the memory MEM has 16-bit data terminal DQ, the circuit illustrated in FIG. 3 is formed for each data terminal DQ. For example, when the memory MEM has 16-bit data terminal DQ, 16 circuits are formed.

The pre-charge control signal line BRS1R or BRS2L is commonly coupled to the pre-charge circuits PRE of the sense amplifier area SAA. The switch control signal line MUX1 or MUX2 is commonly coupled to the connection switches BT of the sense amplifier area SAA. Each connection switch BT includes an nMOS transistor. The connection switch BT connects the bit lines BL and /BL to bit lines SBL and /SBL of the sense amplifier SA, or disconnects the bit lines BL and /BL from the bit lines SBL and /SBL of the sense amplifier SA. The strength of connection of the bit line BL, SBL, /BL or /SBL, for example, the on-resistance of the connection switch BT, is dependent on a voltage of the switch control signal MUX1 or MUX2 supplied to the gate of the connection switch BT. The sense amplifier activation signal lines PSA2 and NSA2 are commonly coupled to the sense amplifier SA of the sense amplifier area SAA. Column switch signal lines CL20 to CL22 are respectively coupled to the column switches CSW. The sense amplifier area SAA may include the same as or similar configuration to that of a general DRAM.

Figure 4:
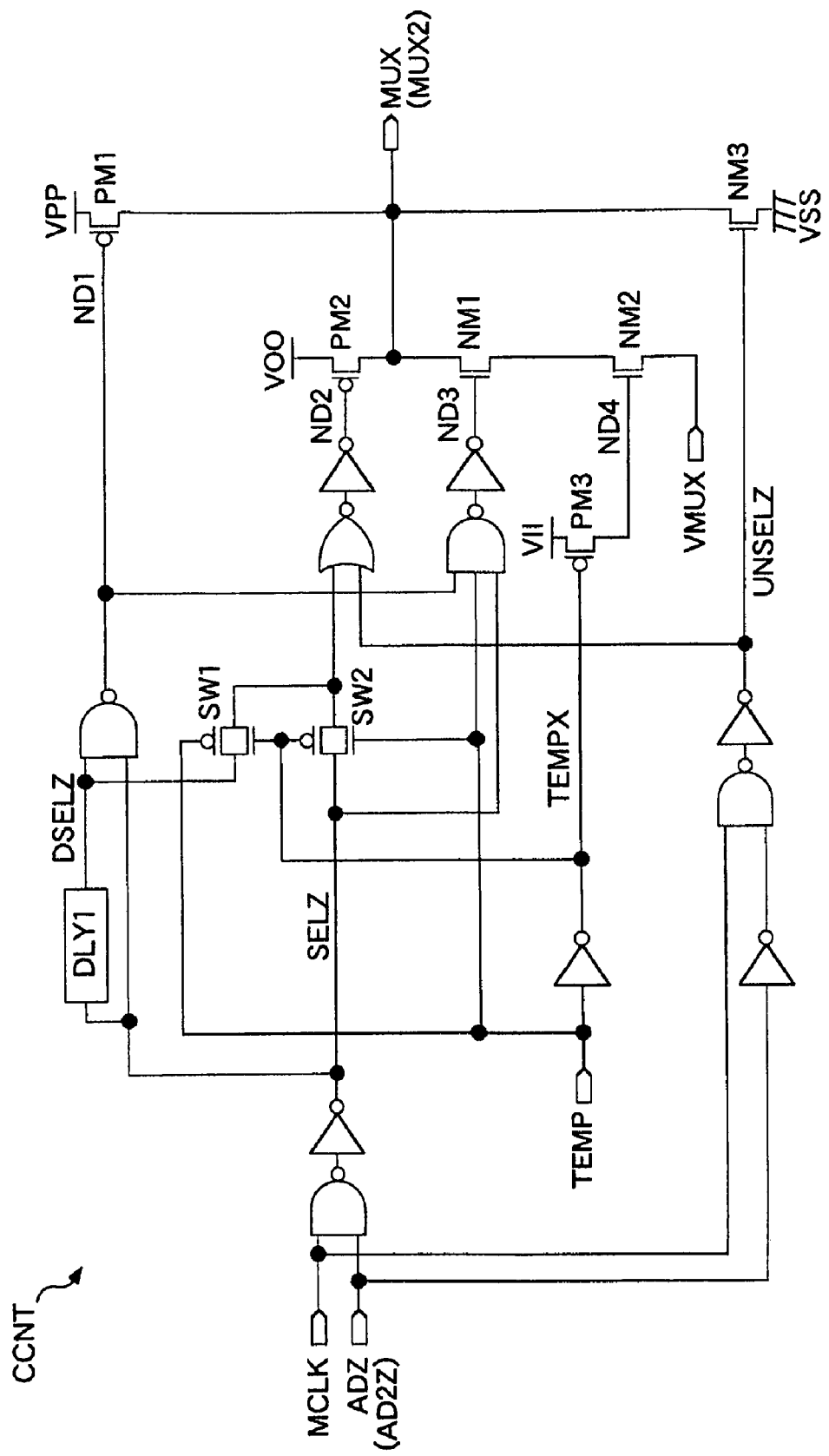
FIG. 4 illustrates an exemplary connection control circuit.

FIG. 4 illustrates an exemplary connection control circuit CCNT illustrated in FIG. 2. The connection control circuits CCNT0L to CCNT3L and CCNT0R to CCNT3R have the same or similar configuration to one another. Thus, the connection control circuit CCNT2L (or CCNT2R) corresponding to the memory block RBLK2 will be described.

The connection control circuit CCNT includes a pMOS transistor PM1 for setting the switch control signal line MUX to the first high-level voltage VPP, a pMOS transistor PM2 for setting the switch control signal line MUX to the second high-level voltage VOO, nMOS transistors NM1 and NM2 for setting the switch control signal line MUX to a low-level voltage VMUX, and an nMOS transistor NM3 for setting the switch control signal line MUX to a ground voltage VSS.

When the memory block RBLK2 is accessed, and, for example, when AD2Z is at a high level, the pMOS transistor PM1 turns on a delay time corresponding to a delay circuit DLY1 behind a leading edge of the bit control signal MCLK, and turns off in synchronization with a trailing edge of the bit control signal MCLK. While the bit control signal MCLK is at a low level, the pMOS transistor PM2 turns on in accordance with a low-level signal transmitted through a switch SW1 or SW2 and a low-level unselected signal UNSELZ. When the temperature signal TEMP is at a low level, for example, when the switch SW1 turns on in a high-temperature state, the pMOS transistor PM2 turns on the delay time DLY1 behind the leading edge of the bit control signal MCLK. The switches SW1 to SW2 may be, for example, CMOS transmission gates.

When the temperature signal TEMP is at a high level, and, for example, in a low-temperature state, the nMOS transistor NM1 turns on the delay time DLY1 behind the leading edge of the bit control signal MCLK. The nMOS transistor NM2 turns on when the temperature signal TEMP is at a high level. When the memory block RBLK2 is not accessed, for example, when AD2Z is at a low level, the nMOS transistor NM3 turns on while the bit control signal MCLK is at a high level.

Figure 5:
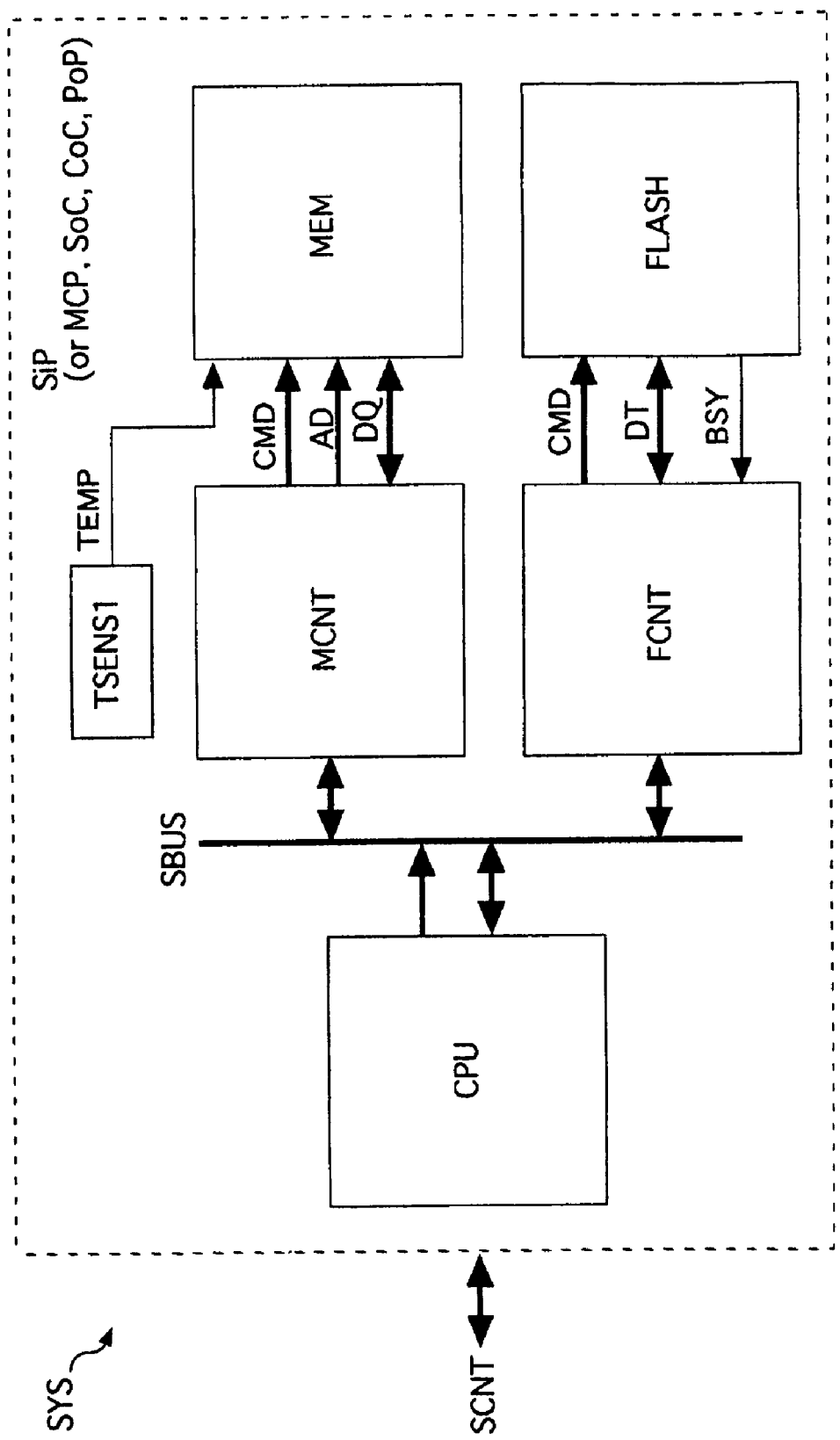
FIG. 5 illustrates an exemplary system on which a memory is mounted.

FIG. 5 illustrates an exemplary system on which the memory MEM illustrated in FIG. 1 may be mounted. The system SYS is, for example, a portion of a portable device, such as a cellular phone. In the following embodiments as well, the same or similar system to that of FIG. 5 will be applied. The system SYS may include a system in package SiP in which a plurality of chips are mounted on a package substrate, such as a lead frame. The system SYS may include a multi-chip package MCP in which a plurality of chips are laminated on a package substrate. The system SYS may include a system on chip SoC in which a plurality of macros are integrated on a silicon substrate. The system SYS may be a chip on chip CoC or a package on package PoP.

The SiP includes the memory MEM illustrated in FIG. 1, a memory controller MCNT that accesses the memory MEM, a flash memory FLASH, a memory control FCNT that accesses the flash memory FLASH, a CPU (controller) that controls the system overall, and a temperature sensing circuit TSENS1. The CPU and the memory controllers FCNT and MCNT are coupled to each other through a system bus SBUS. The SiP is coupled to an upper level system through an external bus SCNT. For a read operation of the memory MEM, the CPU outputs a command signal and an address signal (address information) and receives a read data signal from the memory MEM. For a write operation of the memory MEM, the CPU outputs a command signal, an address signal and a write data signal. For an access operation (read operation, program operation or erase operation) of the flash memory FLASH, the CPU outputs a command signal, an address signal and a write data signal to the flash memory FLASH or receives a read data signal from the flash memory FLASH.

The memory controller MCNT outputs a command signal CMD, an address signal AD (address information) and a write data signal DQ to the memory MEM based on the command signal, the address signal and the write data signal from the CPU. The memory controller MCNT also outputs a read data signal DQ from the memory MEM to the CPU. The memory controller FCNT also operates in the same manner. The command signal CMD and the address signal AD for executing a read operation and a write operation of the memory MEM may be directly output from the CPU to the memory MEM. In this case, the memory controller MCNT on the system SYS may be unnecessary.

The temperature sensing circuit TSENS1 detects the temperature in the system SYS or in the memory MEM, and outputs the temperature signal TEMP in accordance with the detected temperature. When the temperature in the system SYS or in the memory MEM is high, for example, higher than or equal to 60° C., the temperature signal TEMP is set to a low level. When the temperature in the system SYS or in the memory MEM is low, for example, lower than 60° C., the temperature signal TEMP is set to a high level. In some aspects, the temperature sensing circuit TSENS1 may be configured to detect 60° C.

Figure 6:
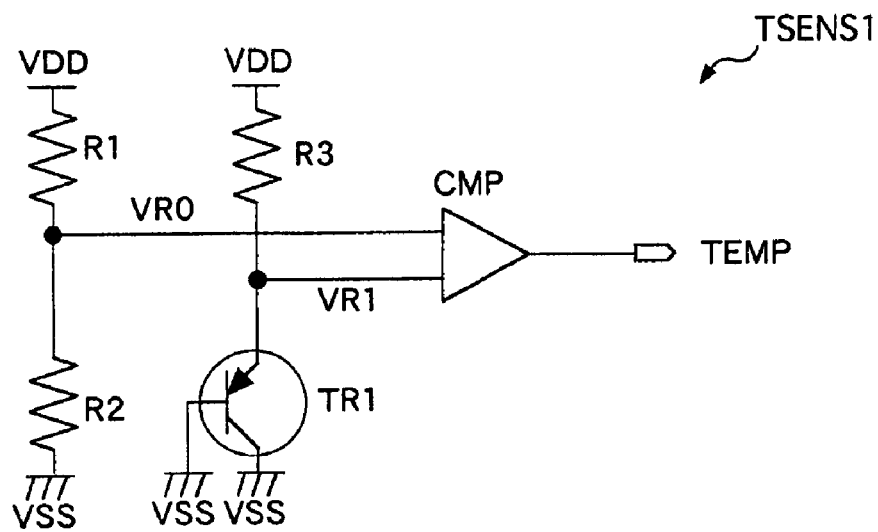
FIG. 6 illustrates an exemplary temperature sensing circuit.

FIG. 6 illustrates an exemplary temperature sensing circuit TSENS1 illustrated in FIG. 5. The temperature sensing circuit TSENS1 includes resistances R1 and R2 arranged in series between the power supply line VDD and the ground line VSS, a resistance R3 arranged in series between the power supply line VDD and the ground line VSS, an NPN transistor TR1, and a comparator CMP that compares voltages of nodes VR0 and VR1. The voltage of the node VR0 increases with an increase in temperature. The voltage of the node VR1 reduces with an increase in temperature.

Figure 7:
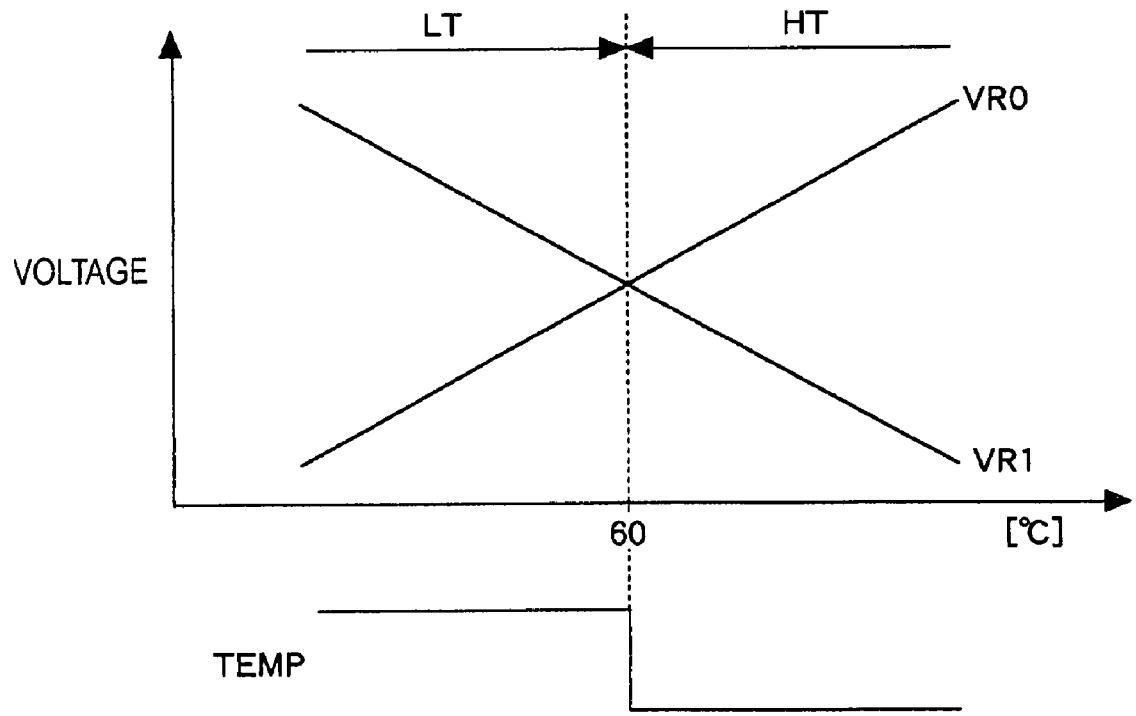
FIG. 7 illustrates an exemplary operation of the temperature sensing circuit.

FIG. 7 illustrates an exemplary operation of the temperature sensing circuit TSENS1 illustrated in FIG. 5. When the voltage of the node VR0 is lower than the voltage of the node VR1, for example, in a low-temperature state LT, the comparator CMP illustrated in FIG. 6 outputs a high-level temperature signal TEMP. When the voltage of the node VR0 is higher than the voltage of the node VR1, for example, in a high-temperature state HT, the comparator CMP outputs a low-level temperature signal TEMP. The boundary between the low-temperature state LT and the high-temperature state HT is, for example, 60° C.

Figure 8:
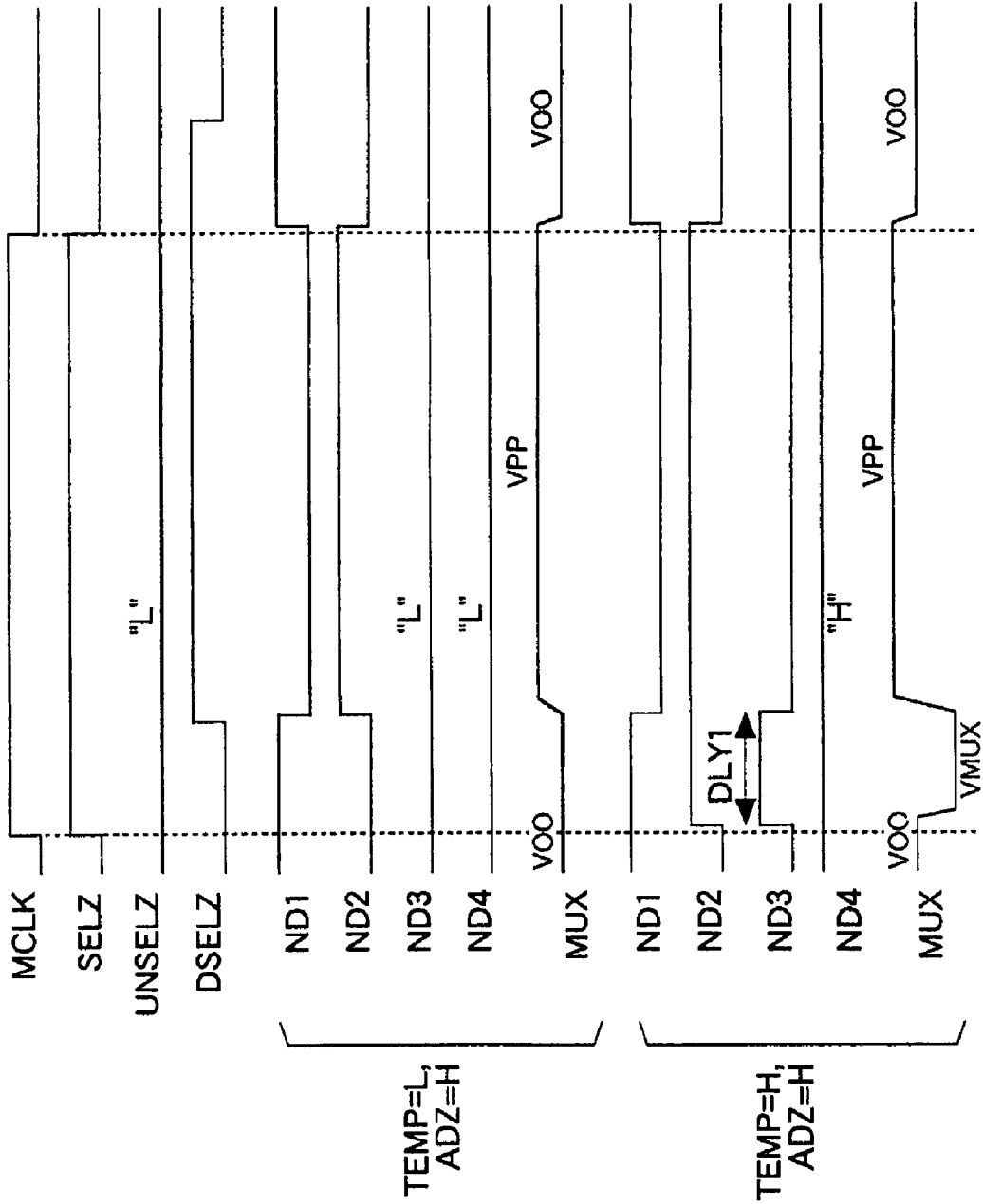
FIG. 8 illustrates an exemplary operation of the connection control circuit.

FIG. 8 illustrates an exemplary operation of the connection control circuit CCNT corresponding to the selected memory block RBLK. When the temperature in the system SYS or in the memory MEM is high, for example, when the TEMP is at a low level, the switch control signal MUX is held at the second high-level voltage VOO after the bit control signal MCLK is activated. The connection switch BT continues to be on when an access operation starts. Thus, connection between the sense amplifier SA and the bit lines BL and /BL is maintained. The switch control signal MUX attains the first high-level voltage VPP after the delay time DLY1, and attains the second high-level voltage VOO in response to de-activation of the bit control signal MCLK.

When the temperature in the system or in the memory MEM is low, for example, when the TEMP is at a high level, the switch control signal MUX is set to a low-level voltage VMUX during the delay time DLY1. The connection switch BT temporarily turns off when an access operation starts. Thus, the sense amplifier SA is disconnected from the bit lines BL and /BL. After that, while the bit control signal MCLK is at a high level, the switch control signal MUX is maintained at the first high-level voltage VPP.

Figure 9:
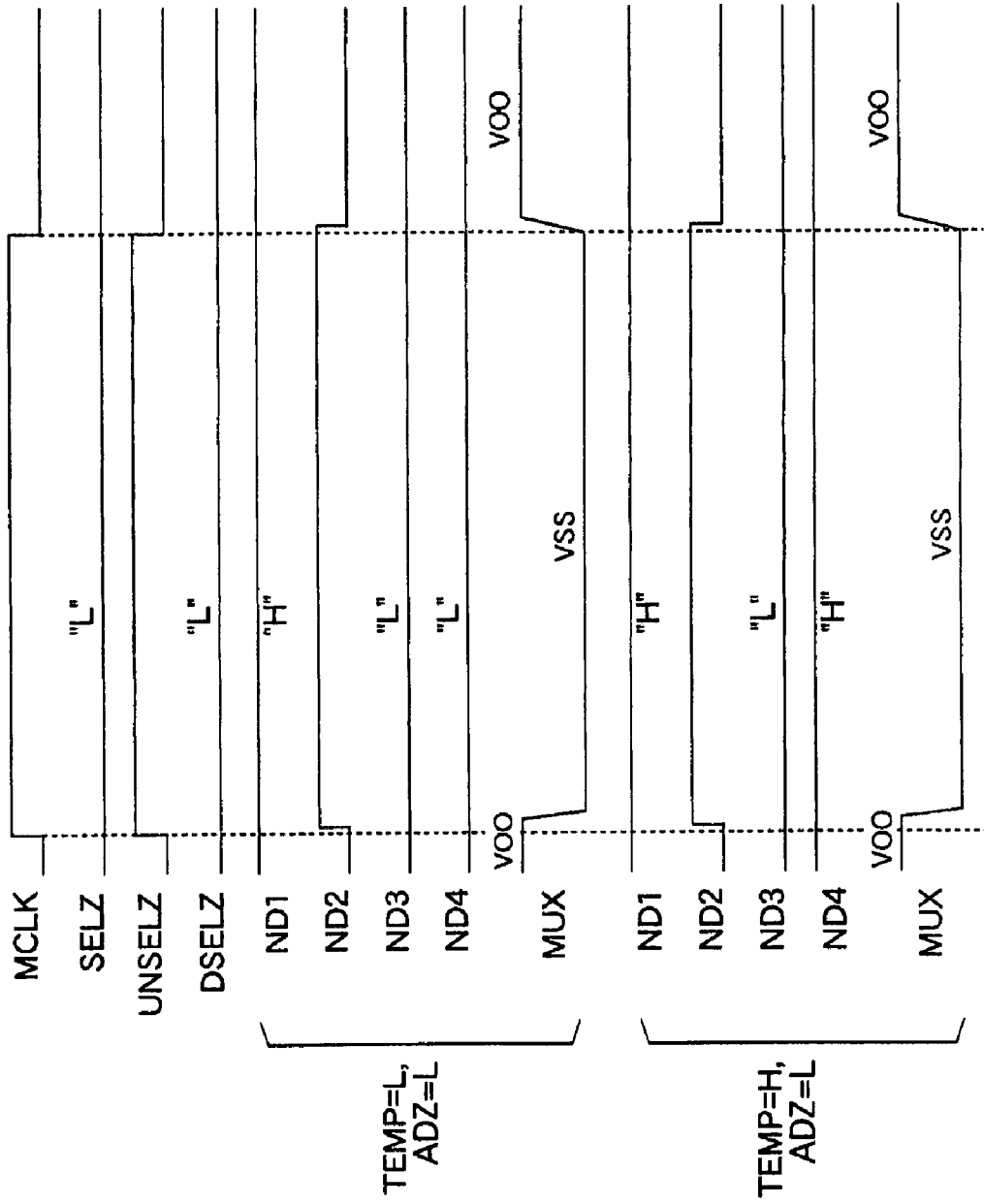
FIG. 9 illustrates another exemplary operation of the connection control circuit.

FIG. 9 illustrates another exemplary operation of the connection control circuit CCNT corresponding to the unselected memory block RBLK. In the unselected memory block RBLK, irrespective of the temperature in the system SYS or in the memory MEM, the switch control signal MUX is set to the ground voltage VSS while the bit control signal MCLK is being activated. In the non-accessed memory block RBLK, the bit lines BL and /BL and the sense amplifier SA are not coupled.

Figure 10:
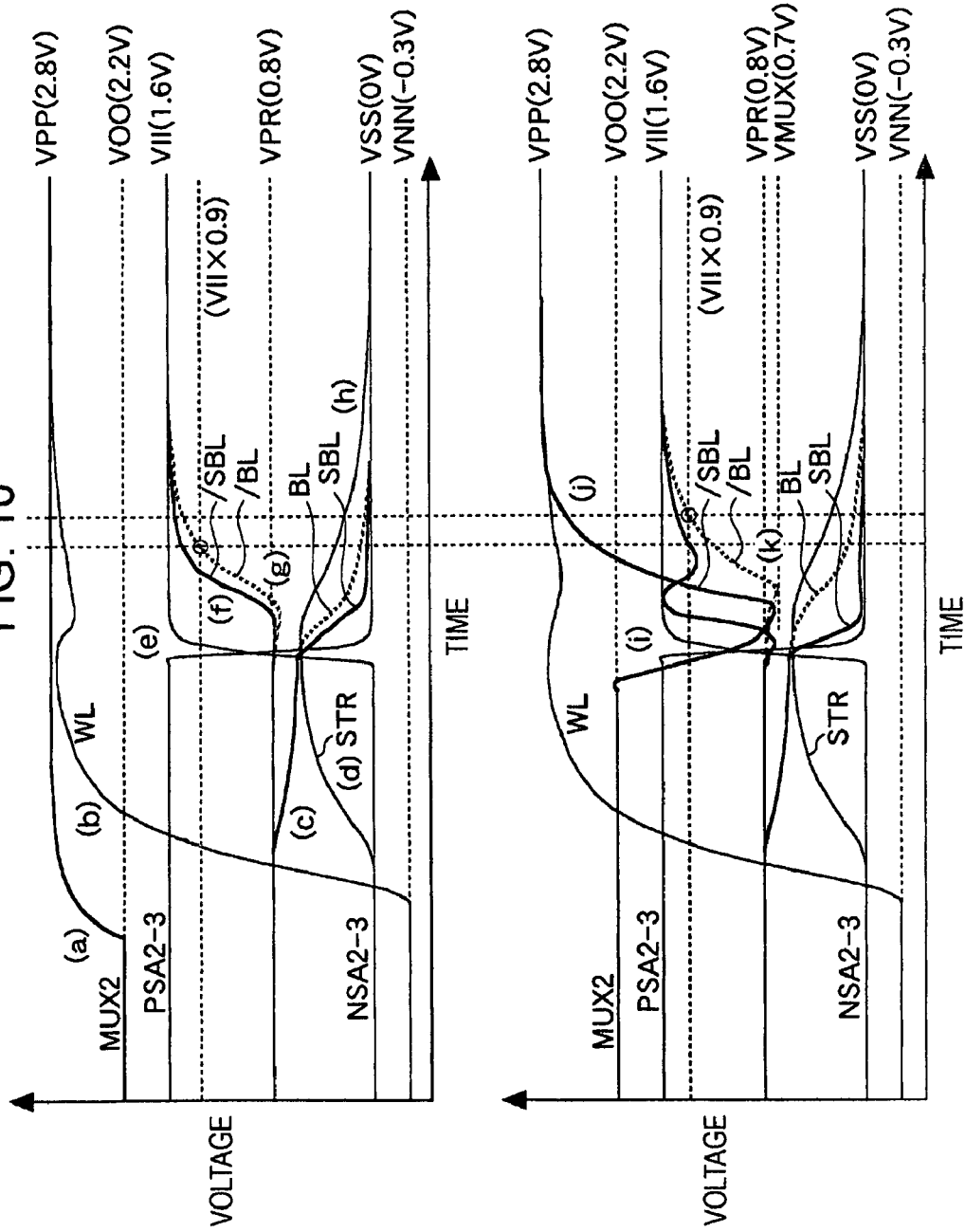
FIG. 10 illustrates exemplary simulated waveforms in a read operation.

FIG. 10 illustrates exemplary simulated waveforms in a read operation of the memory MEM illustrated in FIG. 1. In FIG. 10, the memory block RBLK2 is accessed, and a low-level signal is read from the memory cell MC coupled to the bit line BL. The bit line /BL operates as a reference voltage line. The upper-side waveforms illustrate the case when the switch control signal MUX2 is maintained at a high level VOO or VPP, for example, when the sense amplifier SA is not disconnected from the bit lines BL and /BL. The lower-side waveforms illustrate the case when the switch control signal MUX2 is temporarily changed to a low level, for example, when the sense amplifier SA is disconnected from the bit lines BL and /BL. The waveforms of the word line WL and the sense amplifier activation signals PSA2, PSA3, NSA2 and NSA3 are the same or similar between the upper-side waveforms and the lower-side waveforms in FIG. 10.

In the upper-side waveforms in FIG. 10, in response to a read command, the switch control signal MUX2 corresponding to the memory block RBLK2 changes from the voltage VOO to the voltage VPP ((a) in FIG. 10). Because the on-resistance of the connection switch BT decreases, electric charge read from the memory cell MC to the bit line BL is reliably transmitted to the bit line SBL of the sense amplifier SA.

After the switch control signal MUX changes to the voltage VPP, the word line WL is activated ((b) in FIG. 10). By the activation of the word line WL, electric charge is read from the memory cell MC to the bit line BL, and the voltage of the bit line BL decreases ((c) in FIG. 10). Thus, a voltage difference occurs between the bit line BL and the bit line /BL that operates as the reference voltage line. The voltage of a storage node STR in the memory cell MC increases with the reading of electric charge ((d) in FIG. 10). The storage node STR is a connection node between the transfer transistor and capacitor in the memory cell MC.

After a predetermined period of time has elapsed from the activation of the word line WL, the sense amplifier activation signals PSA2, PSA3, NSA2 and NSA3 are activated, and then the sense amplifier SA starts an amplify operation ((e) in FIG. 10). A voltage difference between the bit line SBL and bit line /SBL of the sense amplifier SA is amplified ((f) in FIG. 10). Because the connection switch BT is turned on, the voltages of the bit lines BL and /BL change following changes in voltage of the bit lines SBL and /SBL ((g) in FIG. 10). The voltage of the storage node STR follows the voltage of the bit line BL to reach the ground voltage VSS ((h) in FIG. 10). After the bit lines SBL and /SBL respectively change to the ground voltage VSS and the internal power supply voltage VII, the column selection signal CL (not shown) is activated, and then read data signals on the bit lines SBL and /SBL are output through the read amplifier RA and the data input/output circuit 20 to the outside of the memory MEM.

In the lower-side waveforms in FIG. 10, the switch control signal MUX2 temporarily changes to a low level (VMUX=0.7 V) before the sense amplifier SA is activated ((i) in FIG. 10). The switch control signal MUX2 increases to the voltage VPP after the sense amplifier SA starts an amplify operation ((j) in FIG. 10).

Because the switch control signal MUX is at a low level, when the sense amplifier SA starts an amplify operation, a line between the sense amplifier SA and the bit lines BL and /BL is temporarily disconnected. The connection switch BT turns off before the sense amplifier SA is activated, and turns on after the sense amplifier SA is activated. The turn-off of the connection switch BT indicates that the on-resistance of the connection switch BT increases. While the connection switch BT is off, a signal amplified by the sense amplifier SA is not transmitted to the bit lines BL and /BL. Thus, an occurrence of coupling noise of the bit lines BL and /BL is prevented, and erroneous operation of the memory MEM is prevented.

Because the bit lines SBL and /SBL of the sense amplifier SA have small wiring capacitances, the voltages of the bit lines SBL and /SBL change steeply with respect to the ground voltage VSS and the internal power supply voltage VII. The voltages of the bit lines BL and /BL change following the bit lines SBL and /SBL in response to the change in switch control signal MUX to a high level ((k) in FIG. 10).

While the switch control signal MUX is at a low level, the on-resistance of the connection switch BT increases. Thus, driving of the bit lines BL and /BL by the sense amplifier SA delays. For example, as shown by the circular symbols in FIG. 10, time at which the voltage of the bit line /BL attains 90% of the voltage VII is later than time at which the switch control signal MUX reaches the high level VOO or the voltage VPP. The voltage changes of the bit lines SBL and /SBL are the same or similar to the voltage changes of the bit lines BL and /BL. When the switch control signal MUX temporarily changes to a low level, read access time becomes longer. When the read access time elongates, read cycle time also becomes longer. The read access time is the time from when the read command is supplied until when the read data signal is output to the data terminal DQ. The read cycle time is a minimum supply interval of the read command.

Figure 11:
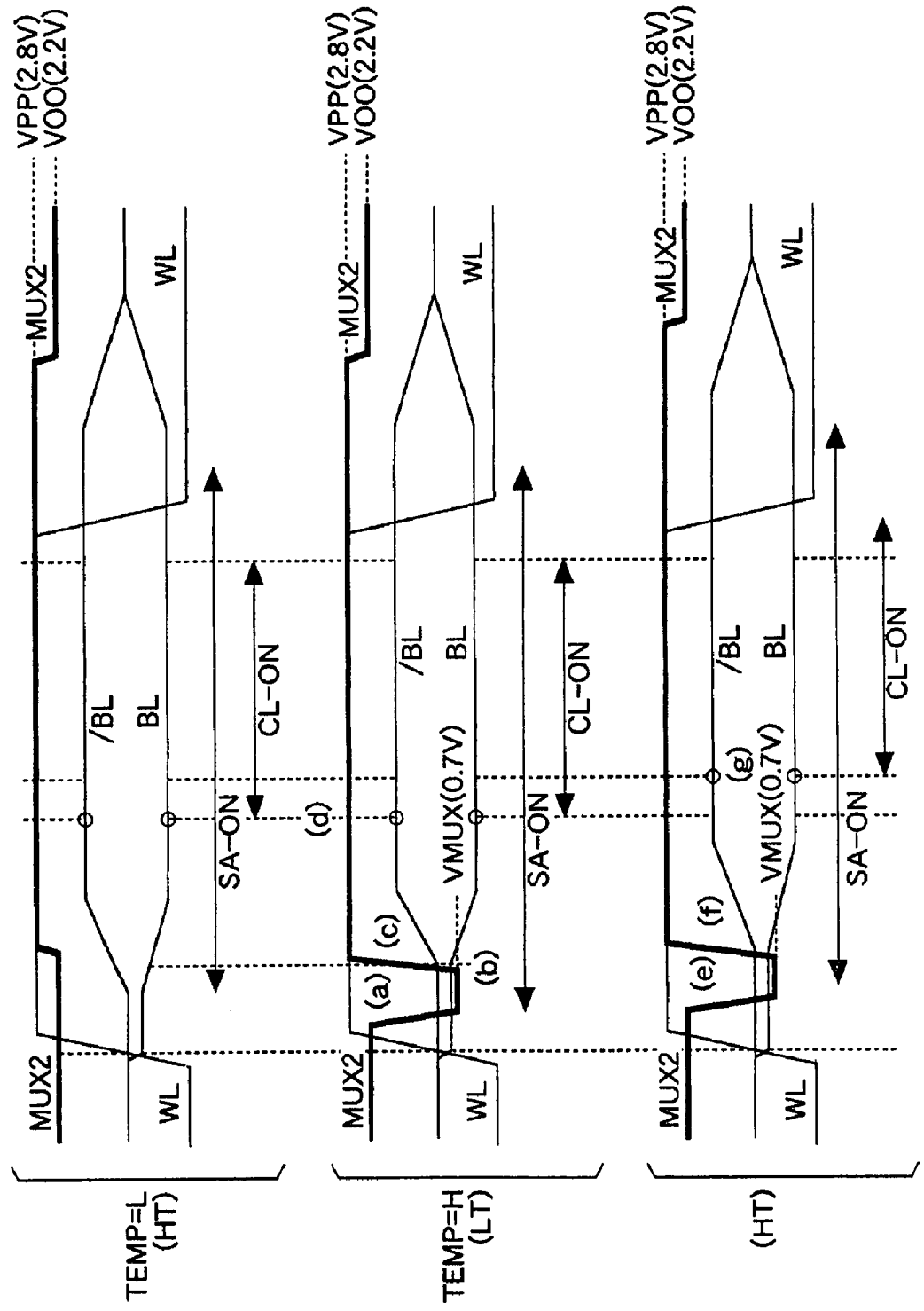
FIG. 11 illustrates an exemplary memory read operation.

FIG. 11 illustrates an exemplary read operation of the memory MEM illustrated in FIG. 1. The memory block RBLK2 is accessed, and a low-level signal is read from the memory cell MC coupled to the bit line BL.

As illustrated in the middle in FIG. 11, when the temperature in the system SYS or in the memory MEM is low, for example, when the TEMP is at a high level in the low-temperature state LT, the switch control signal MUX2 temporarily changes to a low level ((a) in FIG. 11) in order to disconnect the sense amplifier SA from the bit lines BL and /BL. As illustrated in FIG. 10, the start timing for starting amplification of the bit lines BL and /BL delays ((b) in FIG. 11). When the temperature in the system SYS or in the memory MEM is low, the operation speed of the transistor increases and then the magnitude of electric current that flows through the wire increases. Time at which the bit lines BL and /BL change respectively to the voltage VSS and VII is substantially the same as that when the temperature in the system SYS or in the memory MEM is high, for example, when the TEMP is at a low level in the high-temperature state HT ((c) in FIG. 11).

As illustrated by the circular symbols in FIG. 11, the on-timing of the column switch CSW in the low-temperature state LT may be set to the same as the on-timing of the column switch CSW in the high-temperature state HT ((d) in FIG. 11). The activation period SA-ON of the sense amplifier SA in the low-temperature state LT may be set to the same as the activation period SA-ON of the sense amplifier SA in the high-temperature state HT. The on period CL-ON of the column switch CSW in the low-temperature state LT may be set to the same as the on period CL-ON of the column switch CSW in the high-temperature state HT. For example, the activation period SA-ON and the on-period CL-ON are designed based on a write operation illustrated in FIG. 12, and the read operation period and the write operation period are the same.

As illustrated at the lower-side in FIG. 11, irrespective of the temperature in the system SYS or in the memory MEM, the switch control signal MUX temporarily changes to a low level ((e) in FIG. 11). For example, in the high-temperature state HT, the timing for starting amplification of the bit lines BL and /BL is delayed ((f) in FIG. 11). As illustrated by the circular symbol in FIG. 11, the on-timing of the column switch CSW delays ((g) in FIG. 11), and the activation period SA-ON and the on-period CL-ON elongate.

Figure 12:
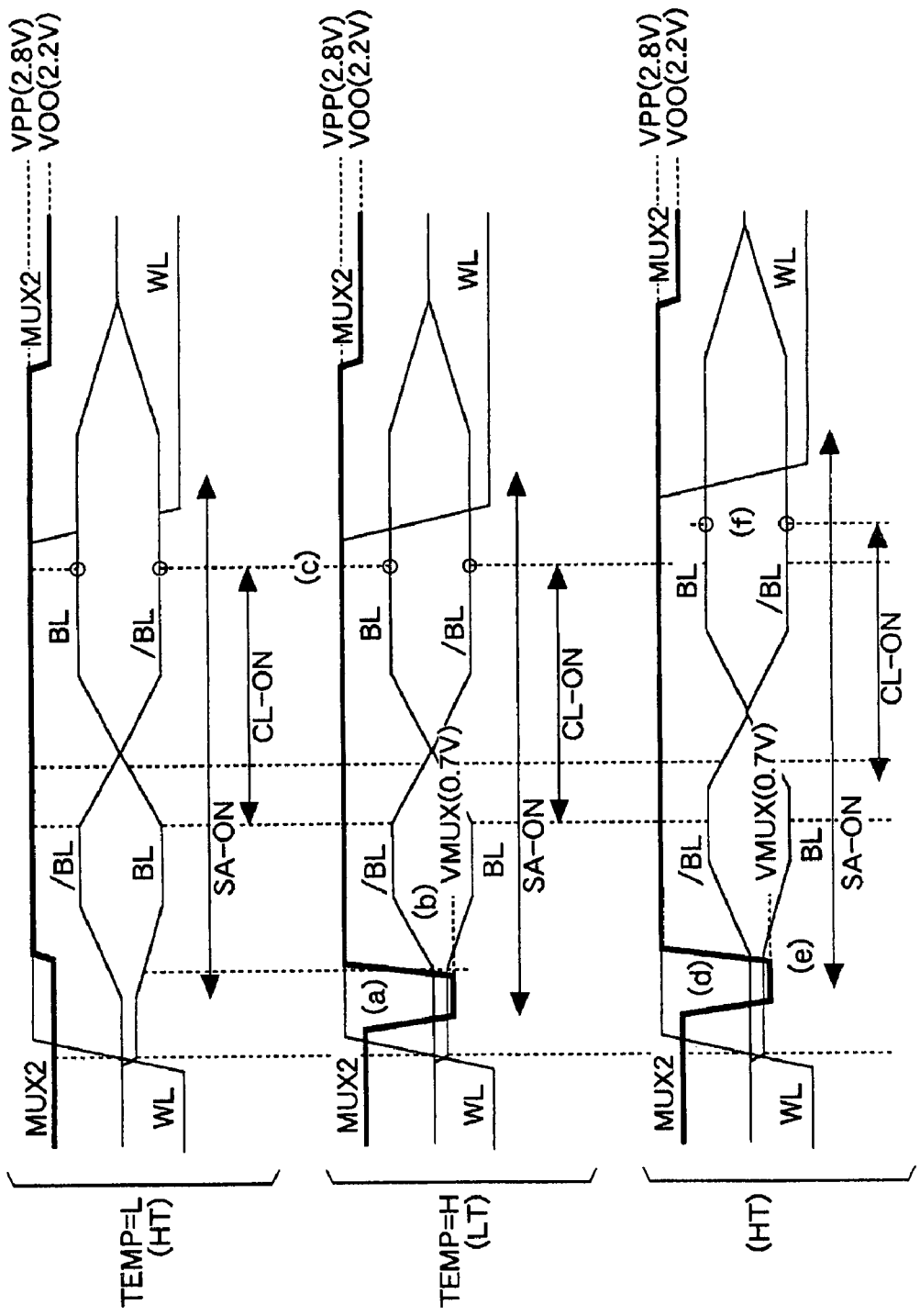
FIG. 12 illustrates an exemplary memory write operation.

FIG. 12 illustrates an exemplary write operation of the memory MEM illustrated in FIG. 1. The memory block RBLK2 is accessed, the bit line BL is coupled, and then a high-level signal is written to the memory cell MC that holds a low-level signal. In a write operation, as in the read operation, when the temperature in the system SYS or in the memory MEM is low, for example, in the low-temperature state LT, the sense amplifier SA is disconnected from the bit lines BL and /BL. The switch control signal MUX temporarily changes to a low level ((a) in FIG. 12). Time at which the bit lines BL and /BL change respectively to the voltage VSS and VII is substantially the same as that when the temperature in the system SYS or in the memory MEM is high, for example, in the high-temperature state HT ((b) in FIG. 12).

As illustrated by the circular symbols in FIG. 12, the off-timing of the column switch CSW in the low-temperature state LT may be set to the same as the off timing of the column switch CSW in the high-temperature state HT ((c) in FIG. 12). The activation period SA-ON of the sense amplifier SA in the low-temperature state LT may be set to the same as the activation period SA-ON of the sense amplifier SA in the high-temperature state HT. The on-period CL-ON of the column switch CSW in the low-temperature state LT may be set to the same as the on-period CL-ON of the column switch CSW in the high-temperature state HT. Write access time and write cycle time become longer.

The switch control signal MUX temporarily changes to a low level ((d) in FIG. 12). In the high-temperature state HT, the timing for stating amplification of the bit lines BL and /BL delays ((e) in FIG. 12). As illustrated by the circular symbols in FIG. 12, the off-timing of the column switch CSW delays ((f) in FIG. 12). The activation period SA-ON and the on-period CL-ON elongate. The write access time and the write cycle time elongate.

In the first embodiment, in accordance with the temperature in the system SYS or in the semiconductor memory MEM, the connection switch BT that couples the sense amplifier SA with the bit line BL or /BL is controlled. Thus, occurrence of noise in the bit lines BL and /BL in accordance with an operation of the sense amplifier SA is prevented and, therefore, access time is not influenced by the noise. In the low-temperature state where the operation speed of the circuit is fast and noise is more likely to be generated, the sense amplifier SA is disconnected from the bit lines BL and /BL. In the high-temperature state where the operation speed of the circuit is slow and noise is less likely to be generated, the sense amplifier SA is not disconnected from the bit lines BL and /BL. Operational errors may be prevented, and the access time and the cycle time are reduced.

Figure 13:
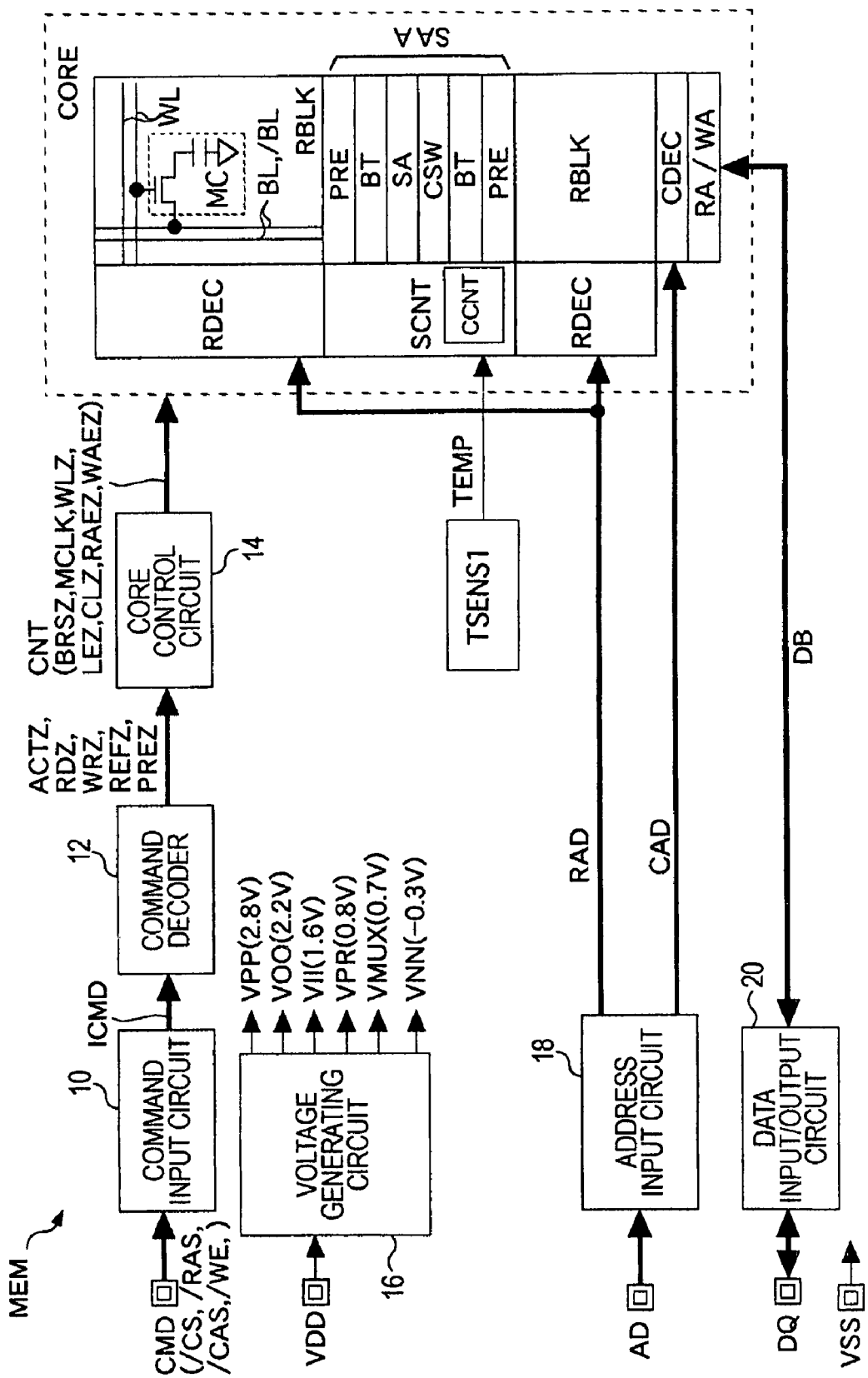
FIG. 13 illustrates a second embodiment.

FIG. 13 illustrates a second embodiment. Like reference numerals denote like elements to those of the first embodiment, and the detailed description thereof is omitted. In the second embodiment, the temperature sensing circuit TSENS1 illustrated in FIG. 6 is formed in the memory chip MEM. The connection control circuit CCNT (not shown) in the switch control portion SCNT controls connection between the sense amplifier SA and the bit lines BL and /BL in response to the temperature signal TEMP output from the temperature sensing circuit TSENS1 in the memory MEM in a read operation. The other configuration of the memory chip MEM is the same as or similar to the configuration illustrated in FIG. 1. The system SYS on which the memory MEM is mounted, for example, SiP, MCP, SoC, CoC, or PoP, does not have a temperature sensing circuit TSENS1. The other configuration of the system SYS on which the memory MEM is mounted is the same as or similar to the configuration as illustrated in FIG. 5. The semiconductor memory MEM may be, for example, a DRAM.

The second embodiment provides the similar advantageous effects to those of the first embodiment. In the second embodiment, because the temperature sensing circuit TSENS1 is formed in the memory chip MEM, the temperature in the memory MEM is accurately sensed.

Figure 14:
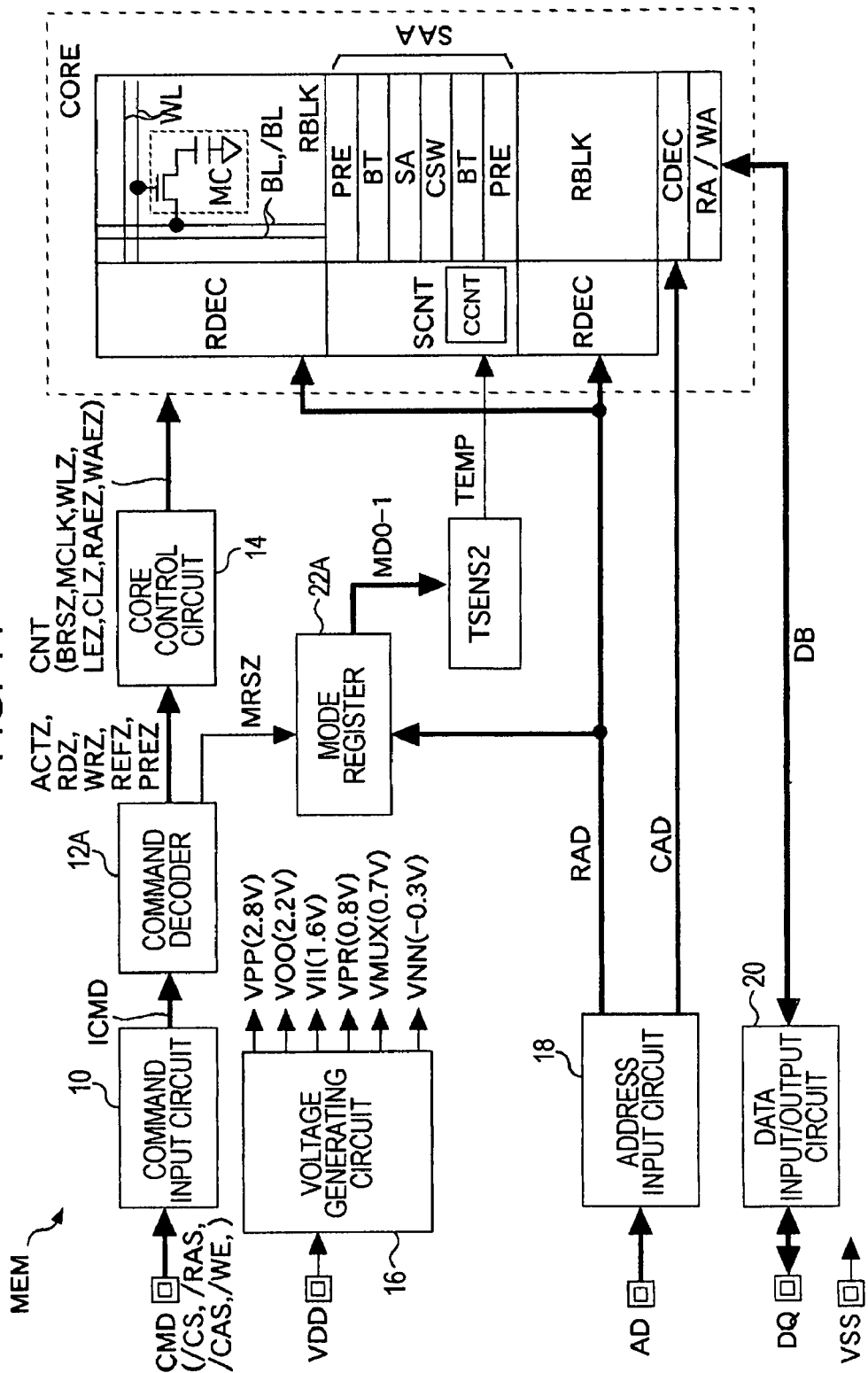
FIG. 14 illustrates a third embodiment.

FIG. 14 illustrates a third embodiment. Like reference numerals denote like elements to those of the first or second embodiment, and the detailed description thereof is omitted. The memory MEM of the third embodiment includes a command decoder 12A, a mode register 22A and a temperature sensing circuit TSENS2. The other configuration of the memory MEM is the same as or similar to the configuration illustrated in FIG. 13. The semiconductor memory MEM may be, for example, a DRAM.

The command decoder 12A, in addition to the functions of the command decoder 12 illustrated in FIG. 1, also outputs a mode register setting command signal MRSZ for setting the mode register 22A. The mode register setting command signal MRSZ is output when a command signal CMD (control signal) of a combination that is not used in a normal access operation is received. For example, when the command decoder 12A receives a low-level /RAS signal and a low-level /CAS signal contemporaneously, the mode register setting command signal MRSZ is activated.

The mode register 22A includes a plurality of registers that are, for example, set in accordance with the row address signal RAD in synchronization with the mode register setting command signal MRSZ. The mode register 22A may be set by the column address signal CAD or by the data signal DQ. The mode register 22A is called a configuration register.

The mode register 22A outputs a mode signal in accordance with the value set in the registers. At least one of the core control circuit 14, the data input/output circuit 20 and the memory core CORE, and the temperature sensing circuit TSENS2 operate in the operation mode corresponding to the mode signal. For example, when the memory MEM is of a clock synchronization type, read latency and burst length are set in the mode register 22A. The read latency is the number of clocks from when a read command is received until when output of read data starts. The burst length is the number of output data signals output from the data terminal DQ in response to a single read command or the number of input data signals received by the data terminal DQ in response to a single write command.

For example, the temperature sensing circuit TSENS2 includes a pull-up circuit that sets the temperature signal TEMP to a high level in response to mode signals MD0 and MD1 (control signal) and a pull-down circuit that sets the temperature signal TEMP to a low level in response to the mode signals MD0 and MD1. The other configuration of the temperature sensing circuit TSENS2 is the same as or similar to the configuration of the temperature sensing circuit TSENS1 illustrates in FIG. 6. For example, when the temperature sensing circuit TSENS2 receives the mode signals MD0 and MD1 having a logic "00", the temperature sensing circuit TSENS2 operates as illustrated in FIG. 7. The connection control circuit CCNT disconnects the sense amplifier SA from the bit lines BL and /BL or connects the sense amplifier SA to the bit lines BL and /BL in accordance with the temperature signal TEMP. When the temperature sensing circuit TSENS2 receives the mode signals MD0 and MD1 having a logic "01", the temperature sensing circuit TSENS2 sets the temperature signal TEMP to a high level irrespective of a temperature. As illustrated in FIG. 8, the connection control circuit CCNT operates in the low-temperature state LT. The switch control signal MUX corresponding to the accessed memory block RBLK temporarily changes to a low level VMUX, so the sense amplifier SA is disconnected from the bit lines BL and /BL.

When the temperature sensing circuit TSENS2 receives the mode signals MD0 and MD1 having a logic "10", the temperature sensing circuit TSENS2 sets the temperature signal TEMP to a low level irrespective of a temperature. As illustrated in FIG. 8, the connection control circuit CCNT operates in the high-temperature state HT. Since the switch control signal MUX corresponding to the accessed memory block RBLK is maintained at the high level VOO or VPP, connection of the sense amplifier SA with the bit lines BL and /BL is maintained.

When the mode signals MD0 and MD1 have a logic "00", the temperature sensing circuit TSENS2 controls connection between the sense amplifier SA and the bit lines BL and /BL based on the temperature in the memory MEM. When the control signals MD0 and MD1 have a logic "01" or "10", the temperature sensing circuit TSENS2 does not control connection between the sense amplifier SA and the bit lines BL and /BL based on the temperature in the memory MEM, and maintains the temperature signal TEMP at a high level or a low level. The mode register 22A sets, based the command signal CMD supplied from the outside of the memory MEM, whether connection between the sense amplifier SA and the bit lines BL and /BL is controlled according to the temperature in the memory MEM.

The third embodiment provides the similar advantageous effects to those of the first or second embodiment. In the third embodiment, in accordance with the value set in the mode register 22A, the sense amplifier SA is connected with the bit lines BL and /BL or disconnected from the bit lines BL and /BL. One chip may include a plurality of memories having different specifications of connecting or disconnecting operation.

Figure 15:
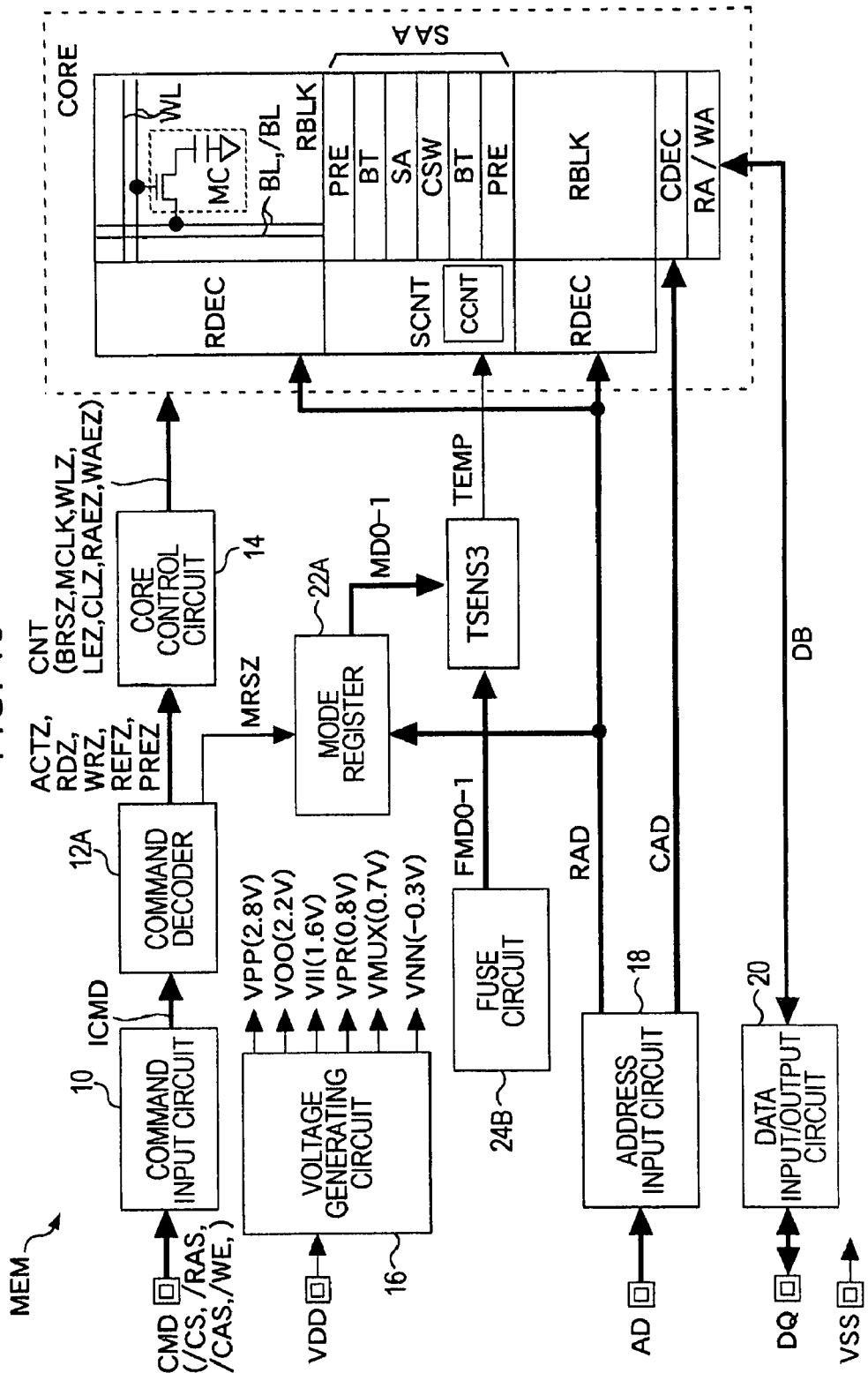
FIG. 15 illustrates a fourth embodiment.

FIG. 15 illustrates a fourth embodiment. Like reference numerals denote like elements to those of the first to third embodiments, and the detailed description thereof is omitted. The memory MEM of the fourth embodiment includes a fuse circuit 24B and a temperature sensing circuit TSENS3. The other configuration of the memory MEM of the fourth embodiment is the same as or similar to the configuration of the memory MEM illustrated in FIG. 14. The semiconductor memory MEM may be, for example, a DRAM.

The fuse circuit 24B, for example, outputs fuse mode signals FMD0 and FMD1 (control signal) having one of logics "00", "01" and "10" in accordance with a programmed internal fuse. The fuse circuit 24B outputs the fuse mode signals FMD0 and FMD1 having a logic "11" when the fuse is not programmed. The meaning of the logic of the fuse mode signals FMD0 and FMD1 is the same as the meaning of the logic of the mode signals MD0 and MD1 illustrated in FIG. 14.

The temperature sensing circuit TSENS3 includes a circuit that receives the fuse mode signals FMD0 and FMD1. The other configuration of the temperature sensing circuit TSENS3 is the same as or similar to the configuration of the temperature sensing circuit TSENS2 illustrated in FIG. 14. When the fuse mode signals FMD0 and FMD1 have a logic "11", the temperature sensing circuit TSENS3, as illustrated in FIG. 14, outputs the temperature signal TEMP in accordance with the logic of the mode signals MD0 and MD1 from the mode register 22A. When the fuse mode signals FMD0 and FMD1 have a logic other than "11", the temperature sensing circuit TSENS3 outputs the temperature signal TEMP in accordance with the logic of the fuse mode signals FMD0 and FMD1 irrespective of the value of the mode signals MD0 and MD1. The connection control circuit CCNT connects the sense amplifier SA with the bit lines BL and /BL or disconnects the sense amplifier SA from the bit lines BL and /BL based on at least one of the control signals MD0 and MD1 from the outside or the control signals FMD0 and FMD1 from the fuse circuit 24B.

When the fuse mode signals FMD0 and FMD1 have a logic "00", as illustrated in FIG. 7, the temperature signal TEMP in accordance with the temperature of the memory MEM is output. When the temperature is low, the connection switch BT temporarily turns off, and the sense amplifier SA is disconnected from the bit lines BL and /BL. When the fuse mode signals FMD0 and FMD1 have a logic "01", the level of the temperature signal TEMP is set to a high level, and the sense amplifier SA is disconnected from the bit lines BL and /BL irrespective of a temperature. When the fuse mode signals FMD0 and FMD1 have a logic "10", the level of the temperature signal TEMP is set to a low level, and connection between the sense amplifier SA and the bit lines BL and /BL is maintained irrespective of a temperature.

The memory MEM of the fourth embodiment, for example, includes a redundant circuit for repairing an error and a redundant fuse circuit for instructing to use an error address or the redundant circuit. The redundant circuit, for example, includes a redundant word line, a redundant bit line, a redundant memory cell, or the like. In an error repairing process, for example, a process of programming the redundant fuse circuit, the fuse circuit 24B is programmed. Depending on the program, the memory MEM having three types of operation specifications are manufactured. The operation specifications are one of (1) the sense amplifier SA is disconnected from the bit lines BL and /BL or connected to the bit lines BL and /BL depending on a temperature, (2) connection of the sense amplifier SA with the bit lines BL and /BL is maintained, and (3) disconnection of the sense amplifier SA from the bit lines BL and /BL is maintained. In a test process occurring before the repairing process, the level of the mode signals MD0 and MD1 is switched by means of the mode register 22A and then the memory MEM is evaluated. The fuse circuit 24B may be programmed in accordance with the above evaluated result.

The fourth embodiment provides the similar advantageous effects to those of the first to third embodiments. The fourth embodiment manufactures the memory MEM having three types of operation specifications using one type of design data. By using the mode register 22A, the memory MEM having three types of operation specifications is evaluated before the fuse circuit 24B is programmed.

Figure 16:
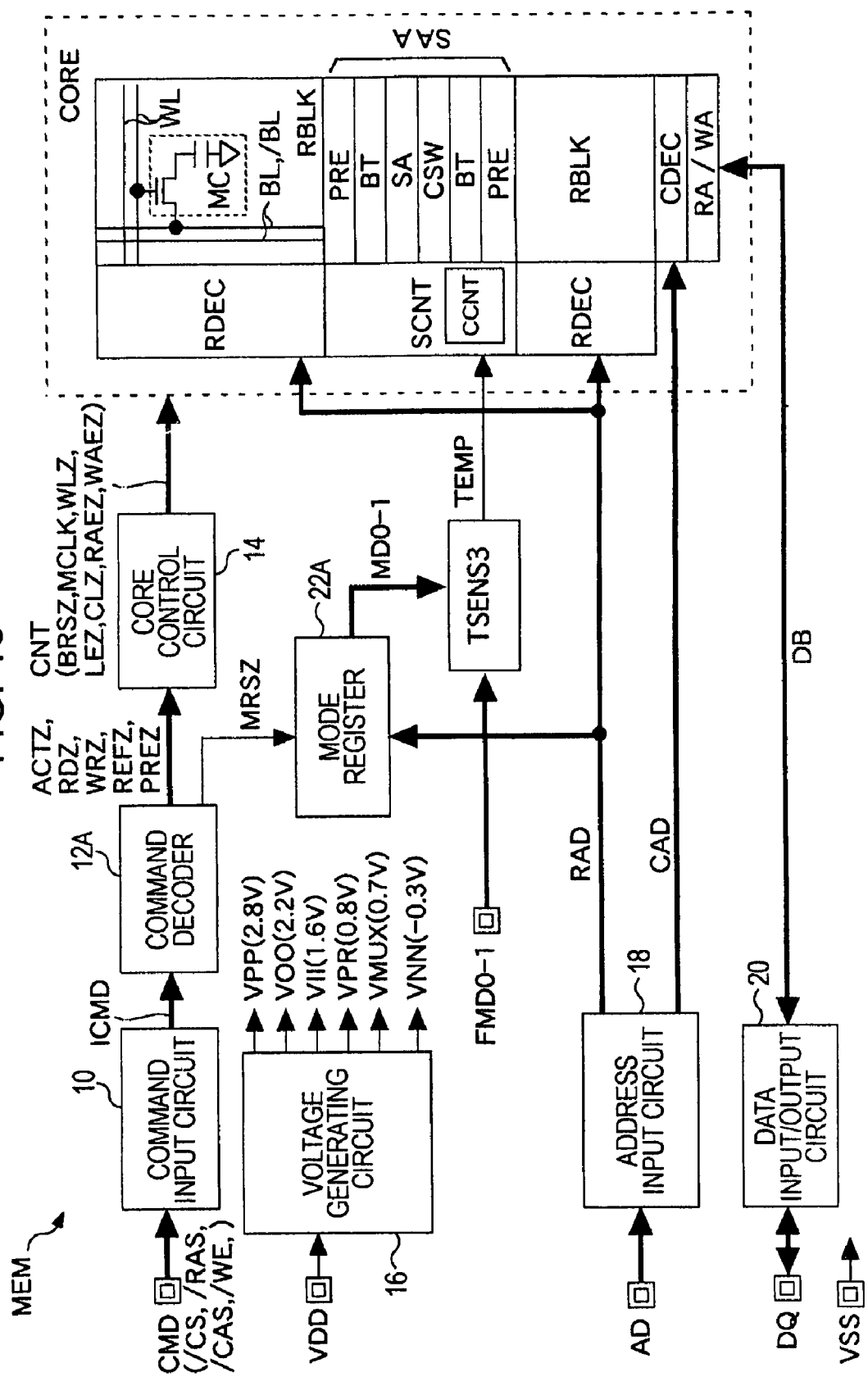
FIG. 16 illustrates a fifth embodiment.

FIG. 16 illustrates a fifth embodiment. In the fifth embodiment, like reference numerals denote like elements to those of the first to fourth embodiments, and the detailed description thereof is omitted. The memory MEM of the fifth embodiment includes an external terminal that receives the fuse mode signals FMD0 and FMD1, in place of the fuse circuit 24B illustrated in FIG. 15. The other configuration of the fifth embodiment is the same as or similar to the configuration illustrated in FIG. 15. The semiconductor memory MEM may be, for example, a DRAM.

The external terminal is coupled to the power supply line VDD or the ground line VSS by, for example, bonding wire in a process of assembling the memory MEM. In the assembling process, the memory MEM having three types of operation specifications is manufactured.

The fifth embodiment provides the similar advantageous effects to those of the first to fourth embodiments. In the fifth embodiment, the fuse mode terminal is coupled to the power supply line VDD or the ground line VSS. Thus, without using the fuse circuit 24B illustrated in FIG. 15, the memory MEM having three types of operation specifications is manufactured.

Figure 17:
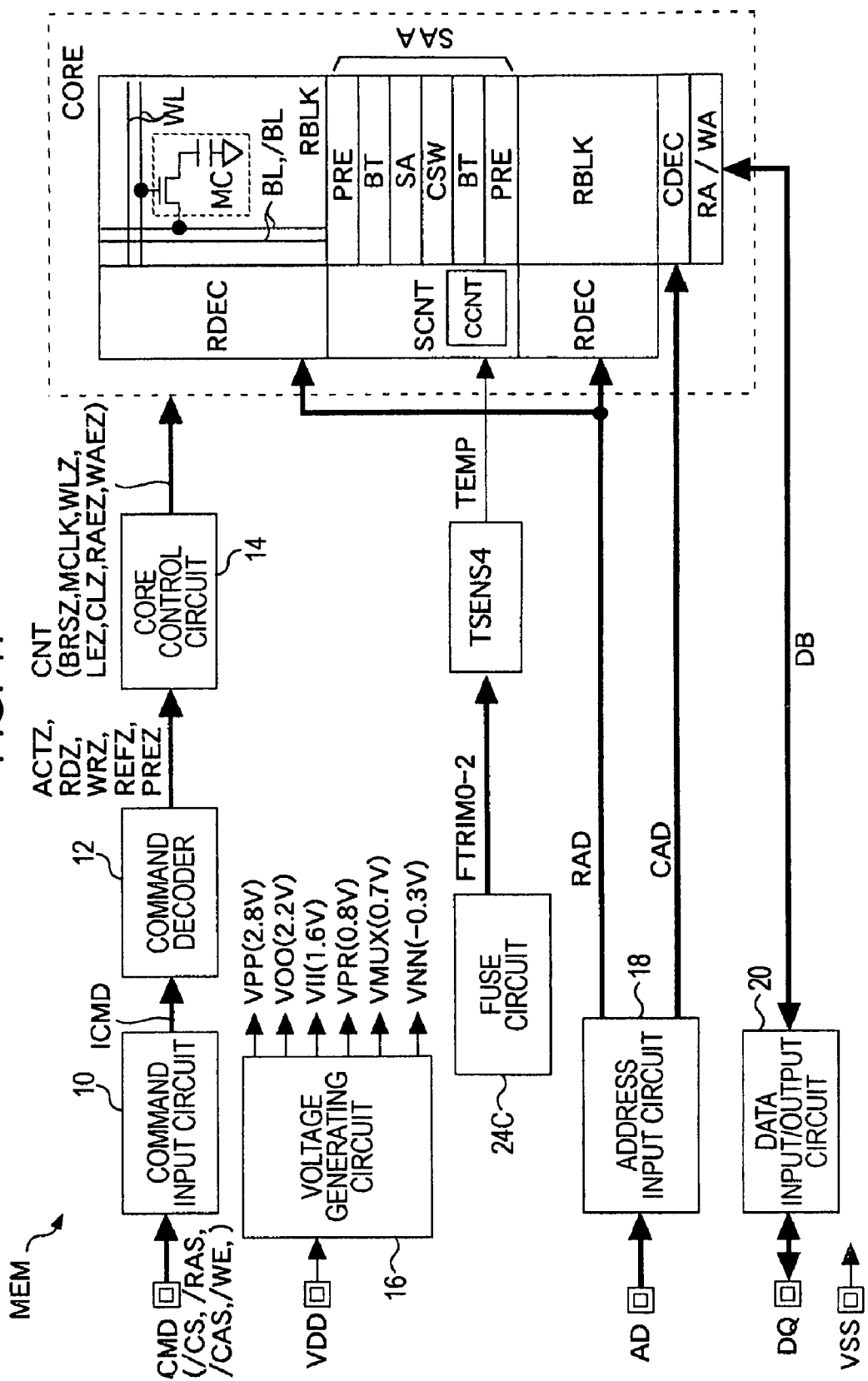
FIG. 17 illustrates a sixth embodiment.

FIG. 17 illustrates a sixth embodiment. In the sixth embodiment, like reference numerals denote like elements to those of the first to fifth embodiments, and the detailed description thereof is omitted. The memory MEM of the sixth embodiment includes a fuse circuit 24C (program circuit) and a temperature sensing circuit TSENS4. The other configuration of the sixth embodiment is the same as or similar to the configuration illustrated in FIG. 1. The semiconductor memory MEM may be, for example, a DRAM.

The fuse circuit 24C, for example, sets one of trimming signals FTRIM0 to FTRIM2 to a high level in accordance with a programmed internal fuse. The temperature sensing circuit TSENS4 adjusts the sensing temperature in accordance with the trimming signal FTRIM0 to FTRIM2. For example, when the trimming signal FTRIM0 is at a high level, the sensing temperature becomes relatively low. When the trimming signal FTRIM2 is at a high level, the sensing temperature becomes relatively high. When the trimming signal FTRIM1 is at a high level, the sensing temperature is, for example, as illustrated in FIG. 7. For example, the fuse circuit 24C, as illustrated in FIG. 15, is programmed in an error repairing process, for example, in a process of programming the redundant fuse circuit.

Figure 18:
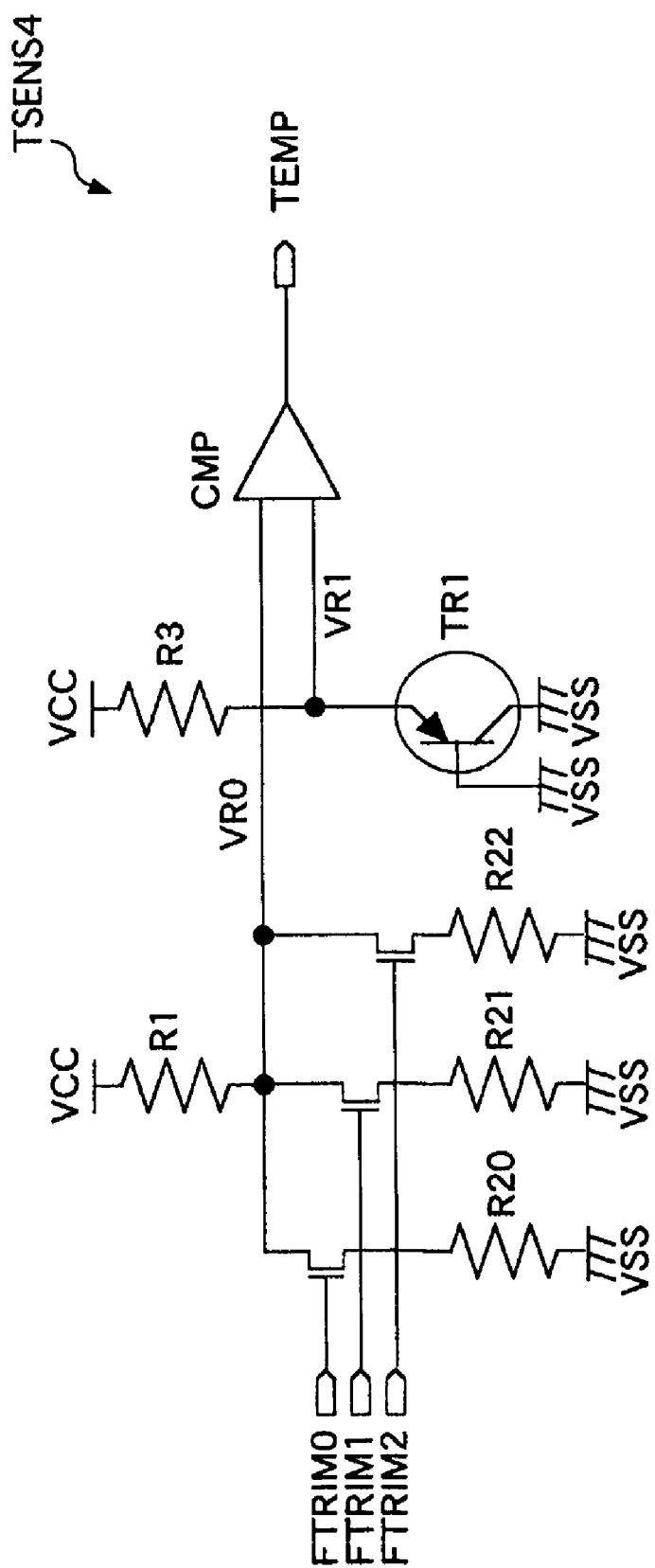
FIG. 18 illustrates an exemplary temperature sensing circuit.

FIG. 18 illustrates an exemplary temperature sensing circuit TSENS4 illustrated in FIG. 17. The temperature sensing circuit TSENS4 includes resistances R20 to R22 coupled in parallel in place of the resistance R2 of the temperature sensing circuit TSENS1 illustrated in FIG. 6. The resistance R20 has a relatively high resistance value. The resistance R21 has a resistance value equal to the resistance R2 illustrated in FIG. 6. The resistance R22 has a relatively low resistance value. The resistances R20 to R22 are coupled to the resistance R1 through the nMOS transistors NM20 to NM22. The gates of the transistors NM20 to NM22 respectively receive the trimming signals FTRIM0 to FTRIM2.

Figure 19:
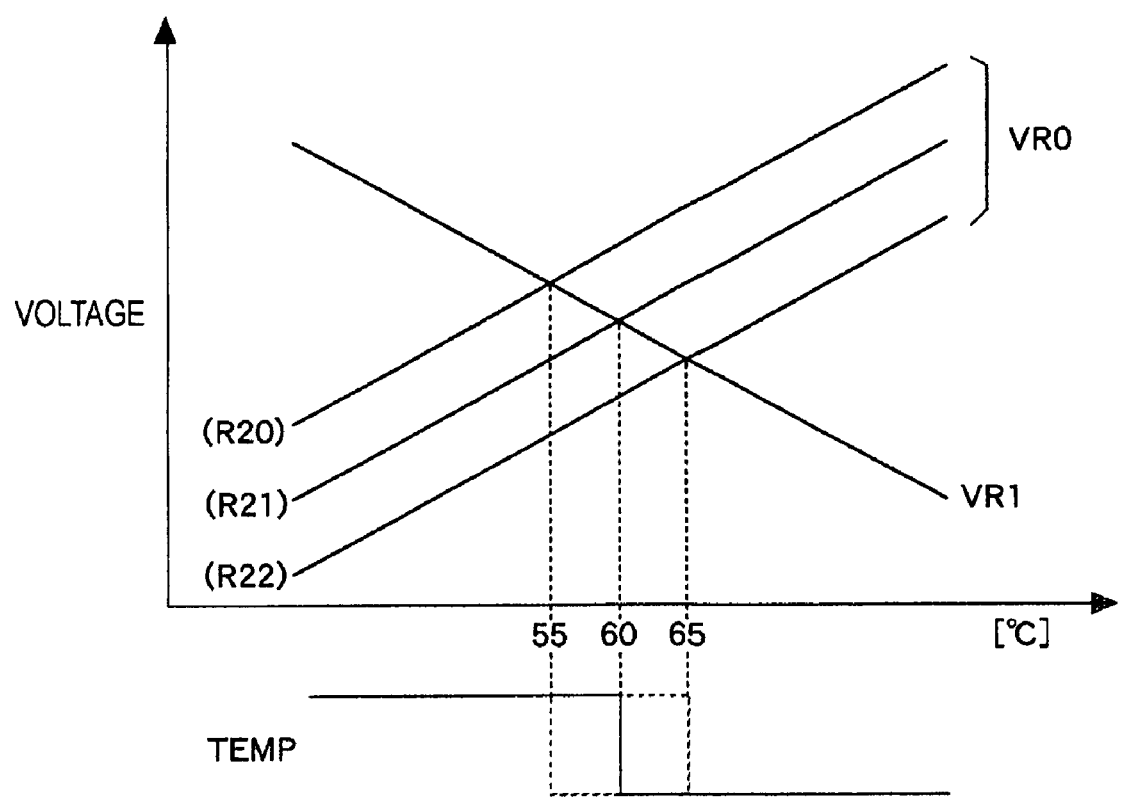
FIG. 19 illustrates an exemplary operation of the temperature sensing circuit.

FIG. 19 illustrates an exemplary operation of the temperature sensing circuit TSENS4 illustrated in FIG. 18. The voltage of the node VR0 varies depending on the resistance, for example, one of the resistances R20 to R22. For example, when the high-level trimming signal FTRIM0 is output and then the resistance R20 is used, the voltage VR0 becomes relatively high, and the sensing temperature decreases, for example, to 55° C. When the high-level trimming signal FTRIM2 is output and then the resistance R22 is used, the voltage VR0 becomes relatively low, and the sensing temperature increases, for example, to 65° C.

In the sixth embodiment, the trimming signals FTRIM0 to FTRIM2 adjust a temperature when the level of the temperature signal TEMP changes. When the trimming signal FTRIM0 is at a high level, the temperature when the sense amplifier SA is disconnected from the bit lines BL and /BL is low. When the trimming signal FTRIM2 is at a high level, the temperature when the sense amplifier SA is disconnected from the bit lines BL and /BL is high. The resistances R20 to R22 and transistors NM20 to NM22 of the temperature sensing circuit TSENS4 adjust a sensing temperature.

The sixth embodiment provides the similar advantageous effects to those of the first to fifth embodiments. In the sixth embodiment, the temperature when disconnection is performed is varied in accordance with how the fuse circuit 24C is programmed. The fuse circuit 24C is programmed in accordance with the electrical characteristics of the memory MEM to be manufactured. Thus, the temperature at which disconnection is performed is optimally set.

Figure 20:
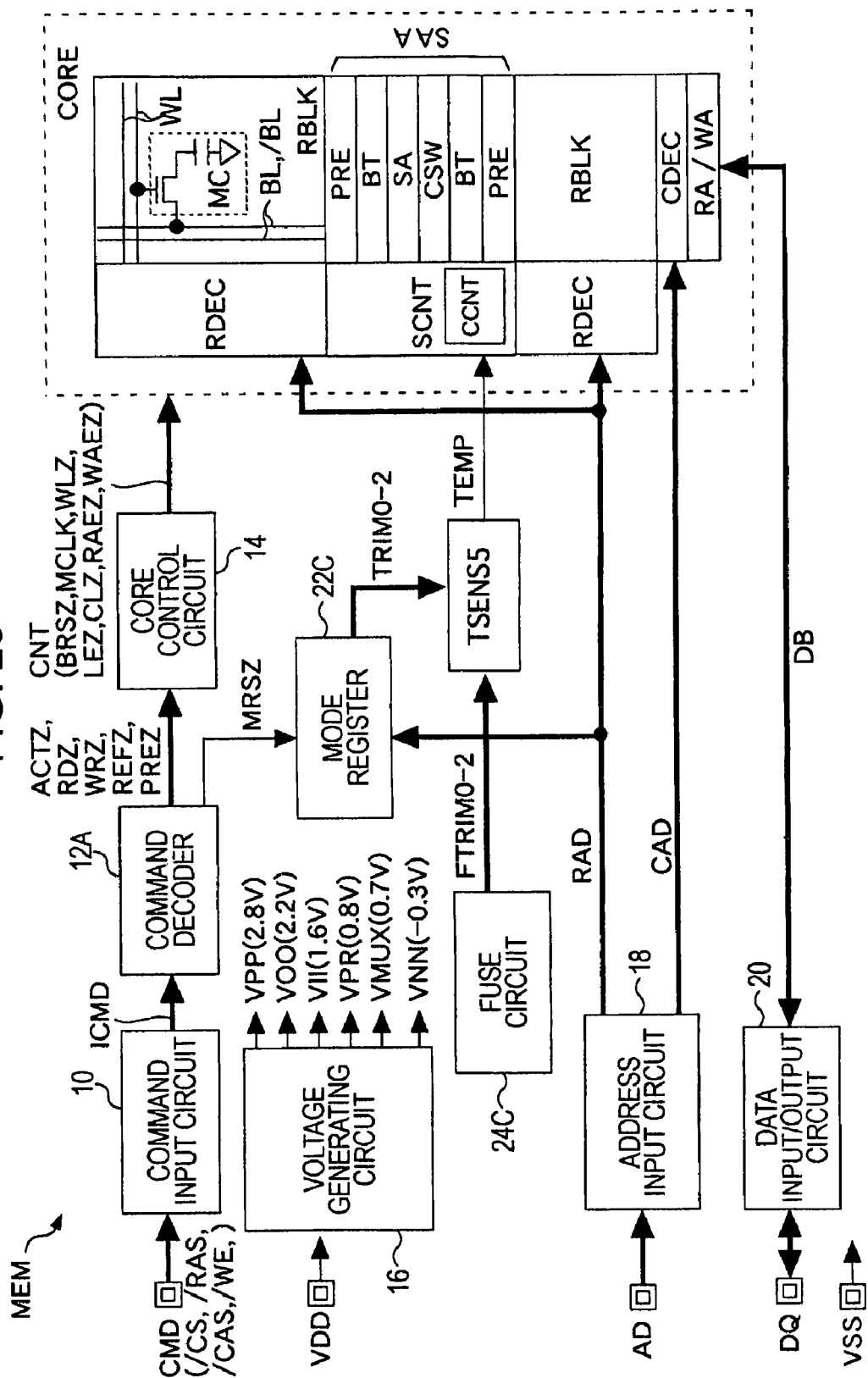
FIG. 20 illustrates a seventh embodiment.

FIG. 20 illustrates a seventh embodiment. In the seventh embodiment, like reference numerals denote like elements to those of the first to sixth embodiments, and the detailed description thereof is omitted. The memory MEM of the seventh embodiment includes a command decoder 12A, a mode register 22C and a temperature sensing circuit TSENS5. The other configuration of the memory MEM is the same as or similar to the configuration illustrated in FIG. 17. The semiconductor memory MEM may be, for example, a DRAM.

The mode register 22C outputs the trimming signals TRIM0 to TRIM2 in place of the mode signals MD0 to MD1. The other configuration of the mode register 22C is the same as or similar to that of the mode register 22A illustrated in FIG. 14. The logic of the trimming signals TRIM0 to TRIM2 is the same as the logic of the trimming signals FTRIM0 to FTRIM2 illustrated in FIG. 17.

The temperature sensing circuit TSENS5 includes a logic circuit (not shown) that is coupled to the gates of the nMOS transistors NM20 to NM22 illustrated in FIG. 18. The other configuration of the temperature sensing circuit TSENS5 is the same as or similar to the configuration of the temperature sensing circuit TSENS4 illustrated in FIG. 18. The logic circuit operates by receiving the trimming signals FTRIM0 to FTRIM2 and TRIM0 to TRIM2.

The temperature sensing circuit TSENS5 turns on the nMOS transistor NM20 when one of the trimming signals FTRIM0 and TRIM0 is at a high level. The temperature sensing circuit TSENS5 turns on the nMOS transistor NM21 when one of the trimming signals FTRIM1 and TRIM1 is at a high level. The temperature sensing circuit TSENS5 turns on the nMOS transistor NM22 when one of the trimming signals FTRIM2 and TRIM2 is at a high level. The temperature sensing circuit TSENS5 does not receive the trimming signals TRIM0 to TRIM2 when the one of the trimming signals FTRIM0 to FTRIM2 is at a high level, and operates in accordance with the trimming signals FTRIM0 to FTRIM2.

In the seventh embodiment, in a process of manufacturing the memory MEM, for example, in a test process, the sensing temperature of the temperature sensing circuit TSENS5 is varied by using the mode register 22C, and then the sensing temperature is evaluated whether it is an optimal value. The mode register 22C adjusts the temperature sensing circuit TSENS5 or the resistances R20 to R22 and transistors NM20 to NM22 based on the control signals CMD and AD from the outside. The fuse circuit 24C is programmed based on the evaluated result, and the sensing temperature of the temperature sensing circuit TSENS5 is trimmed. The fuse circuit 24C is programmed in an error repairing process.

The seventh embodiment provides the similar advantageous effects to those of the first to sixth embodiments. In the seventh embodiment, by using the mode register 22C, the sensing temperature of the temperature sensing circuit TSENS5 is adjusted before programming the fuse circuit 24C and evaluated.

Figure 21:
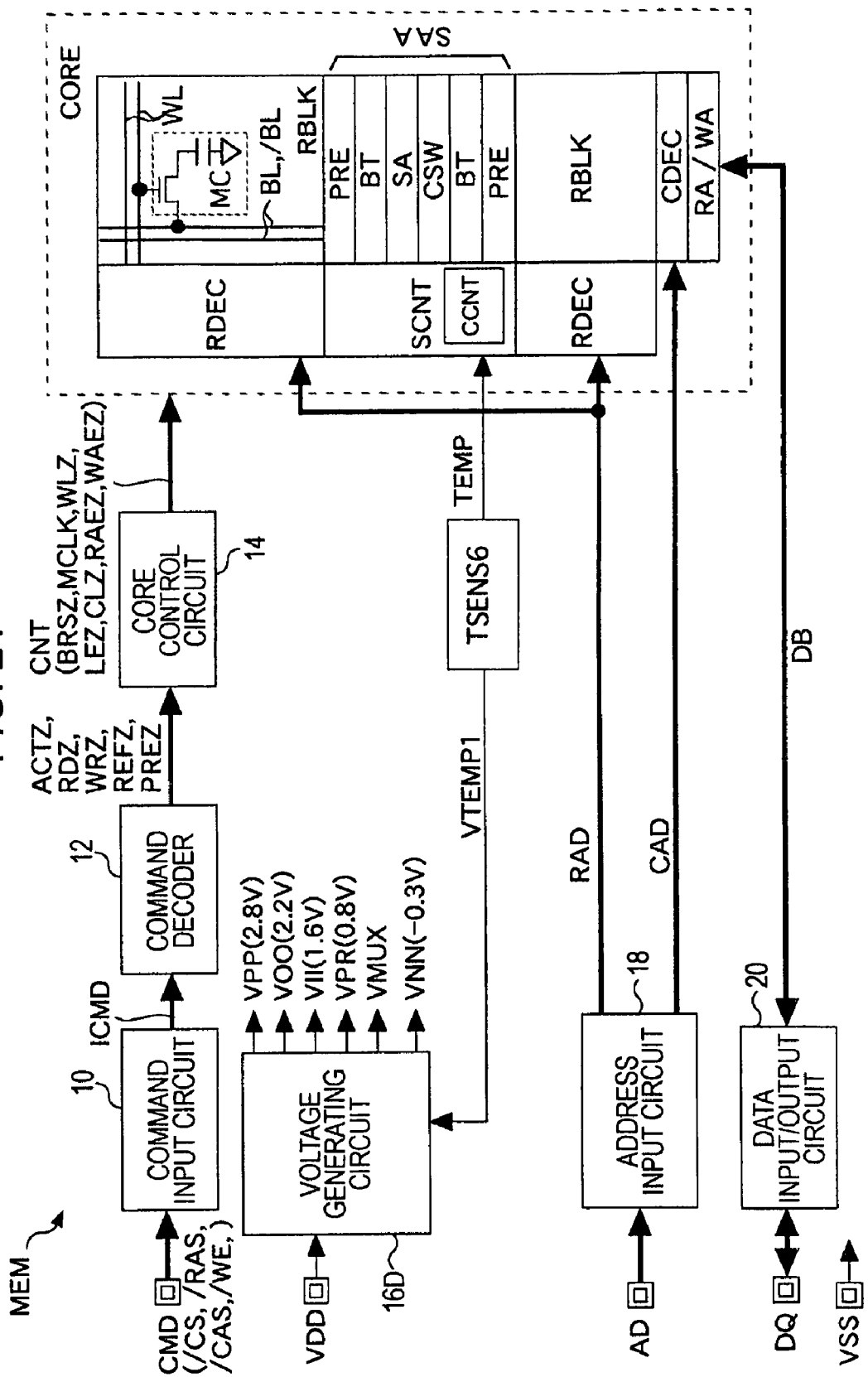
FIG. 21 illustrates an eighth embodiment.

FIG. 21 illustrates an eighth embodiment. In the eighth embodiment, like reference numerals denote like elements to those of the first to seventh embodiments, and the detailed description thereof is omitted. The memory MEM of the eighth embodiment includes a voltage generating circuit 16D and a temperature sensing circuit TSENS6. The other configuration of the memory MEM is the same as or similar to the configuration illustrated in FIG. 13. The semiconductor memory MEM may be, for example, a DRAM.

The temperature sensing circuit TSENS6 generates a sensed voltage VTEMP1 that varies in accordance with the temperature of the memory MEM. For example, the sensed voltage VTEMP1 varies following the voltage VR0 illustrated in FIG. 7. The other function of the temperature sensing circuit TSENS6 is the same as or similar to that of the configuration of the temperature sensing circuit TSENS1 illustrated in FIG. 6. The voltage generating circuit 16D varies a low-level voltage VMUX in accordance with the sensed voltage VTEMP1. For example, the low-level voltage VMUX decreases as the sensed voltage VTEMP1 decreases. The other function of the voltage generating circuit 16D is the same as or similar to that of the configuration of the voltage generating circuit 16 illustrated in FIG. 1.

Figure 22:
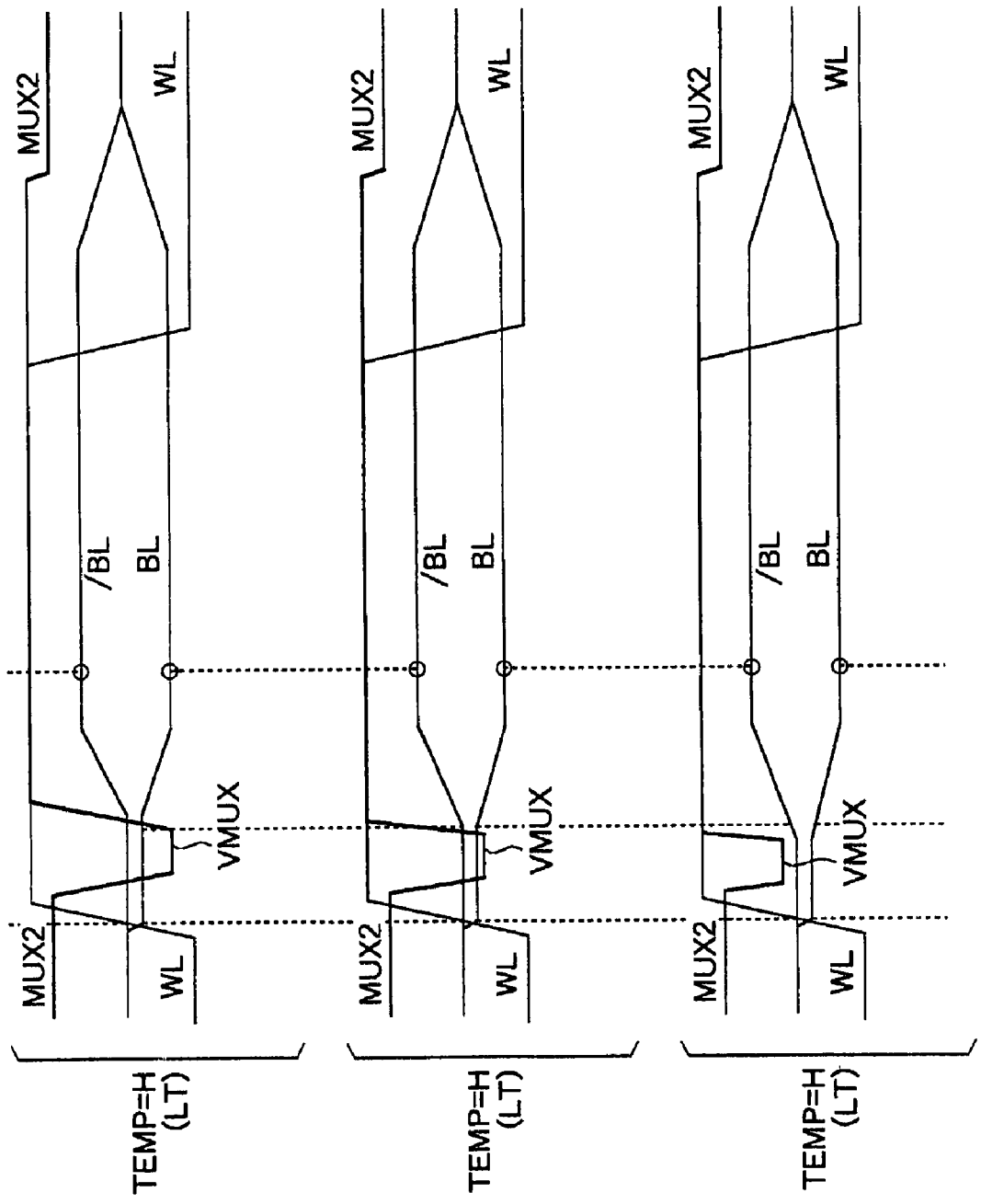
FIG. 22 illustrates an exemplary memory read operation in a low-temperature state.

FIG. 22 illustrates an exemplary read operation of the memory MEM illustrated in FIG. 21 in the low-temperature state LT. For example, the upper-side waveforms, middle waveforms and lower-side waveforms in FIG. 22 respectively indicate the cases when the temperature of the memory MEM is 0° C., 20° C. and 40° C. The switch control signal MUX, for example, the waveform of a pulse signal, varies depending on the temperature of the memory MEM. The waveforms when the temperature of the memory MEM is higher than or equal to 60° C. are the same as the waveforms of the high-temperature state HT illustrated in FIG. 11.

In the eighth embodiment, in the low-temperature state LT, as the temperature decreases (toward the upper side in FIG. 22), the low-level voltage VMUX of the switch control signal MUX decreases and then the on-resistance of the connection switch BT at the time of disconnection increases. Since the connection switch BT is reliably turned off at lower temperatures where noise is likely to occur, an erroneous operation due to noise is prevented. The operation speed of the circuit increases as the temperature decreases. Thus, an increase in access time due to a disconnecting operation is cancelled by improvement in operation speed of the circuit. The turn-off time of the connection switch BT prevents access time from increasing.

The eighth embodiment provides the similar advantageous effects to those of the first to seventh embodiments. In the eighth embodiment, the low-level voltage VMUX of the switch control signal MUX is varied depending on the temperature. A decrease in timing margin of a read operation at the disconnection is prevented.

Figure 23:
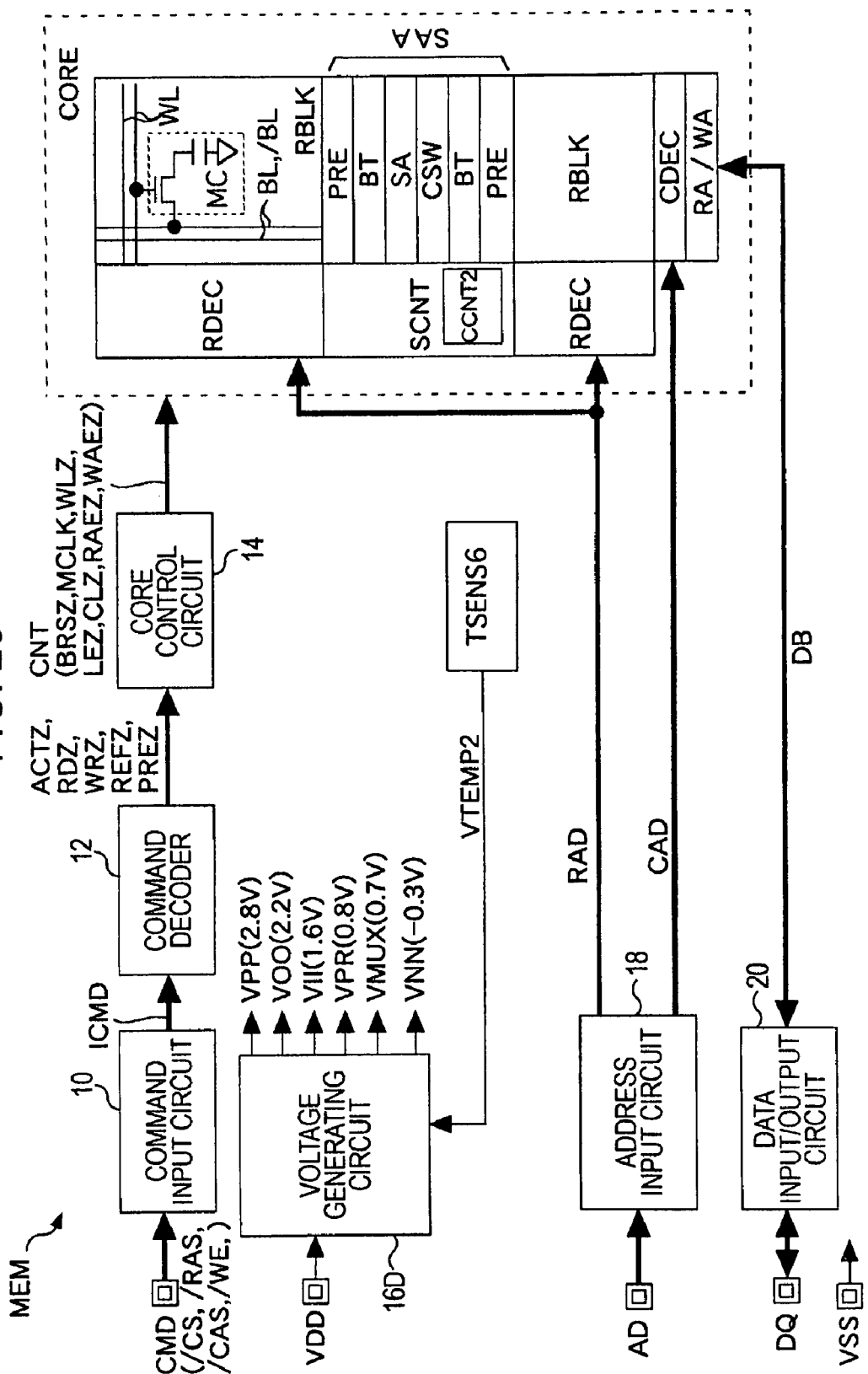
FIG. 23 illustrates a ninth embodiment.

FIG. 23 illustrates a ninth embodiment. In the ninth embodiment, like reference numerals denote like elements to those of the first to eighth embodiments, and the detailed description thereof is omitted. In the memory MEM of the ninth embodiment, the connection control circuit CCNT2 operates without receiving the temperature signal TEMP. The temperature sensing circuit TSENS6 does not output the temperature signal TEMP and outputs a sensed voltage VTEMP2. The other configuration of the memory MEM is the same as or similar to the configuration of the memory MEM illustrated in FIG. 21. The semiconductor memory MEM may be, for example, a DRAM.

Figure 24:
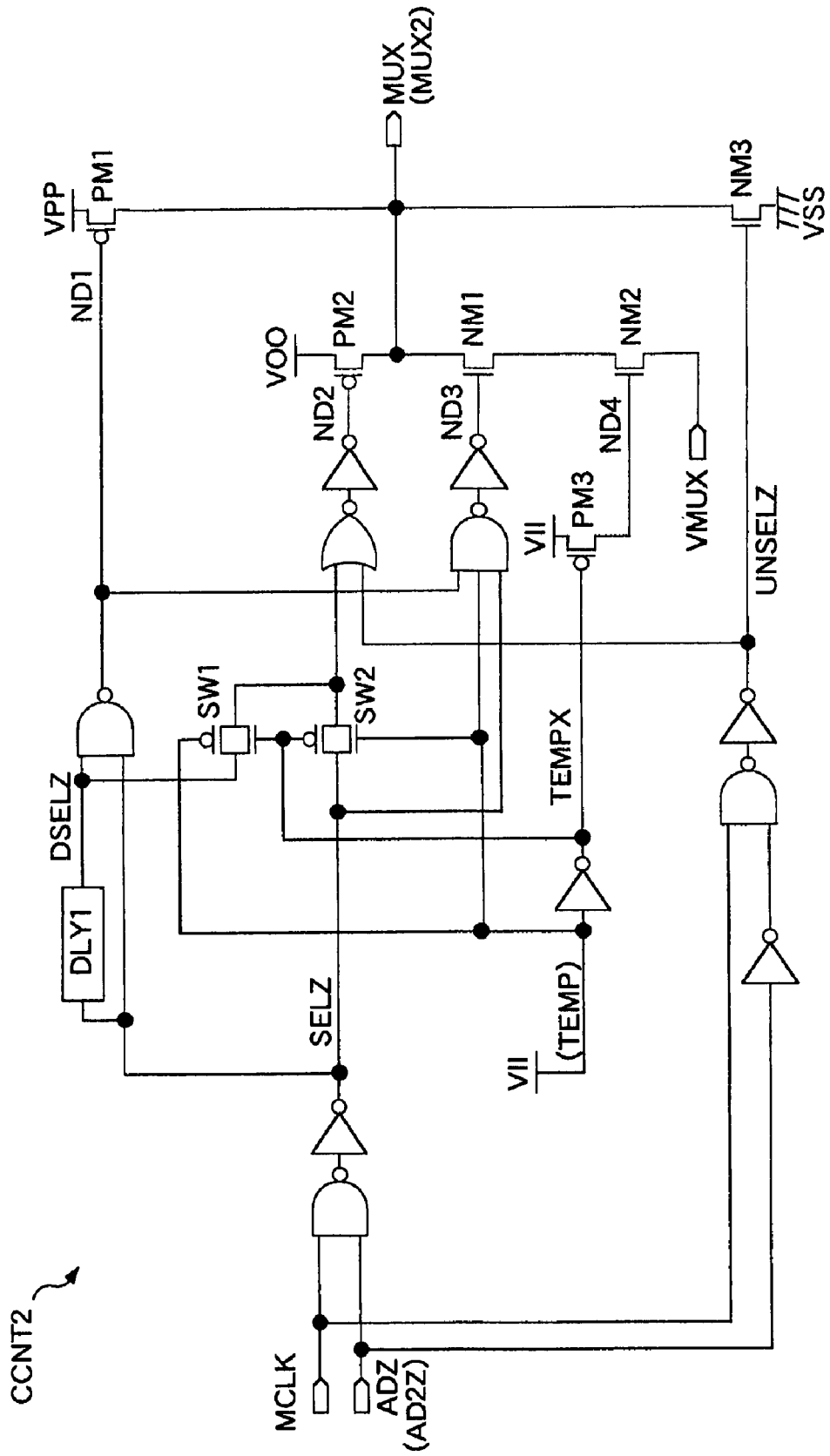
FIG. 24 illustrates an exemplary connection control circuit.

FIG. 24 illustrates an exemplary connection control circuit CCNT2 illustrated in FIG. 23. A terminal of the connection control circuit CCNT2, which receives the temperature signal TEMP, is coupled to a power supply line VII. The other configuration of the connection control circuit CCNT2 is the same as or similar to the configuration of the connection control circuit illustrated in FIG. 4. The connection control circuit CCNT2 disconnects the bit line BL (/BL) from the bit line SBL (/SBL) of the sense amplifier SA in each access operation (read operation, write operation or refresh operation). The connection switch BT temporarily turns off each time the sense amplifier SA is activated. The connection control circuit CCNT receives the low-level voltage VMUX that varies depending on the temperature of the memory MEM.

Figure 25:
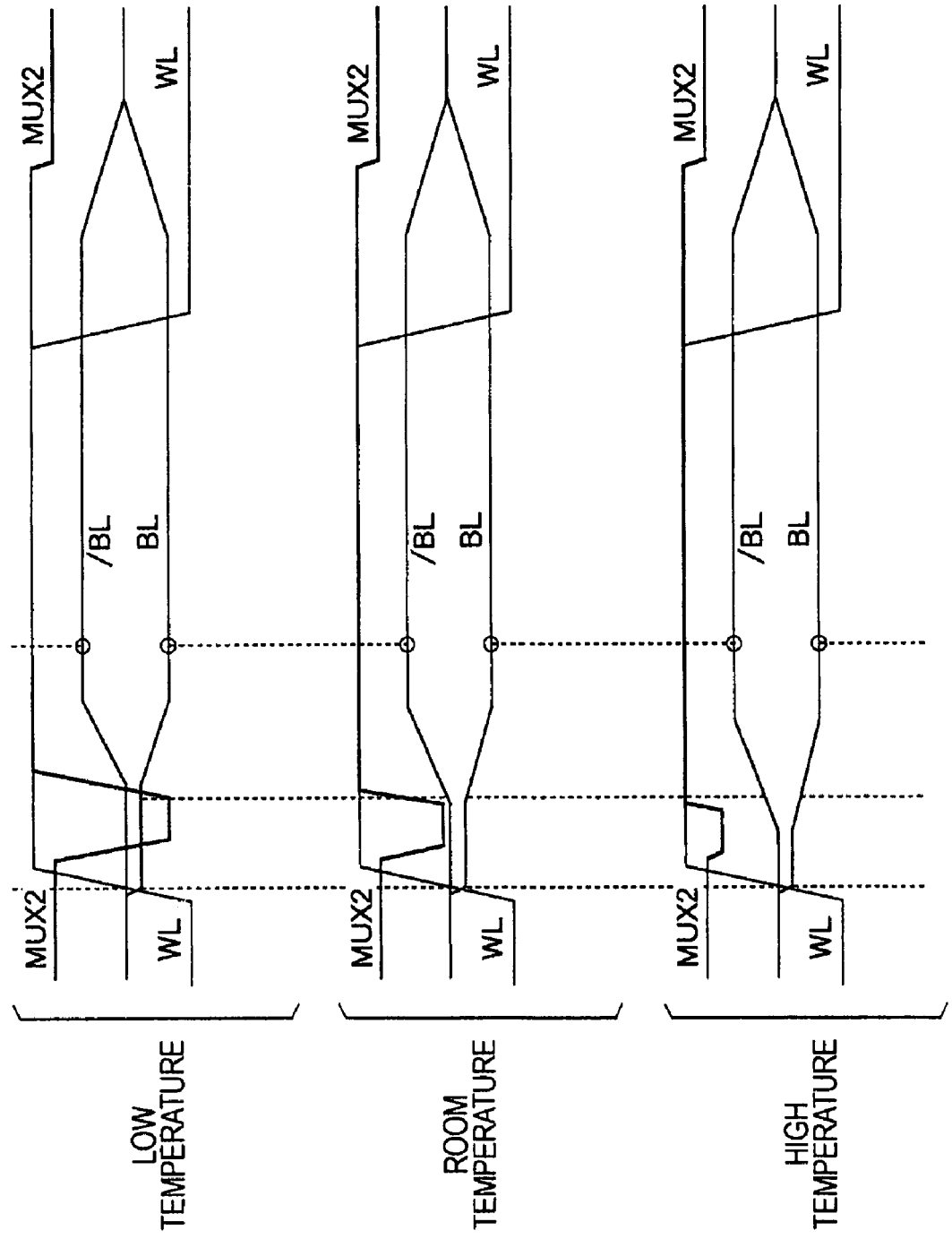
FIG. 25 illustrates an exemplary a memory read operation.

FIG. 25 illustrates an exemplary read operation of the memory MEM illustrated in FIG. 23. The temperatures of the memory MEM in the upper-side waveforms, the middle waveforms and the lower-side waveforms in FIG. 25 correspond to respectively a low temperature (for example, 0° C.), a room temperature (for example, 25° C.) and a high temperature (for example, 70° C.). As the temperature of the memory MEM decreases (toward the upper side in FIG. 25), the low-level voltage VMUX of the switch control signal MUX decreases and then the on-resistance of the connection switch BT increases. As the temperature decreases (toward the upper side in FIG. 25), the low-level voltage VMUX increases and then the on-resistance of the connection switch BT at the time of disconnection decreases. The operation illustrated in FIG. 25 provides the similar advantageous effects to the operation illustrated in FIG. 22.

The ninth embodiment provides the similar advantageous effects to those of the first to eighth embodiments. In the ninth embodiment, the low-level voltage VMUX of the switch control signal MUX is varied depending on the temperature of the memory MEM. Thus, without receiving the temperature signal TEMP, switching between disconnection and connection is gradually performed. By gradually varying the on-resistance of the connection switch BT, switching between disconnection and connection is performed.

Figure 26:
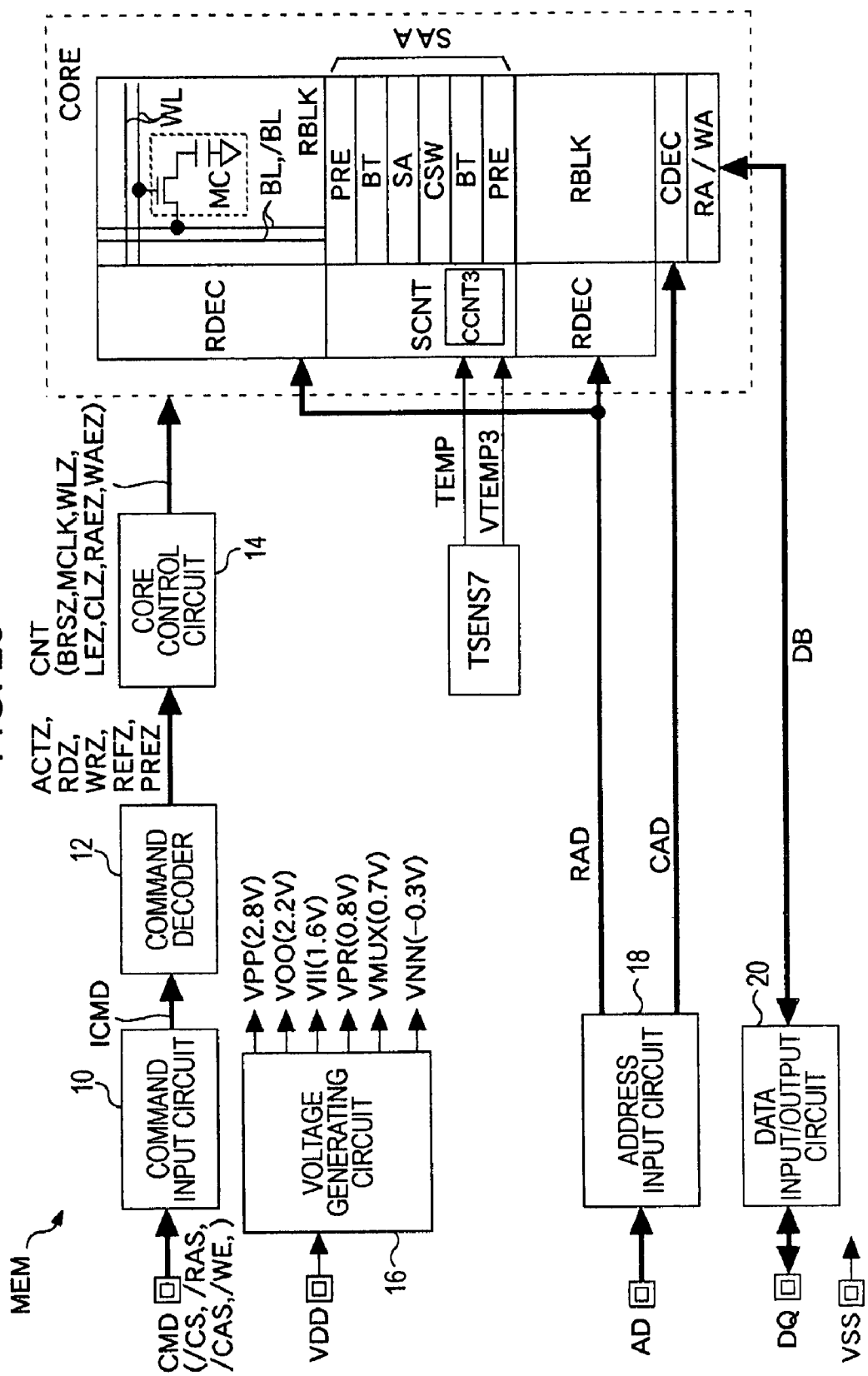
FIG. 26 illustrates a tenth embodiment.

FIG. 26 illustrates a tenth embodiment. In the tenth embodiment, like reference numerals denote like elements to those of the first to ninth embodiments, and the detailed description thereof is omitted. In the memory MEM of the tenth embodiment, the temperature sensing circuit TSENS7 outputs a temperature signal TEMP and a sensed voltage VTEMP3. For example, the sensed voltage VTEMP3 varies following the voltage VR0 illustrated in FIG. 7. In the temperature sensing circuit TSENS7, the sensed voltage VTEMP3 differs from the sensed voltage VTEMP1. The other configuration of the temperature sensing circuit TSENS7 is the same as or similar to the configuration of the temperature sensing circuit TSENS6 illustrated in FIG. 21. The connection control circuit CCNT3 operates by receiving the temperature signal TEMP and the sensed voltage VTEMP3. The other configuration of the memory MEM is the same as or similar to the configuration of the memory MEM illustrated in FIG. 1. The semiconductor memory MEM may be, for example, a DRAM.

Figure 27:
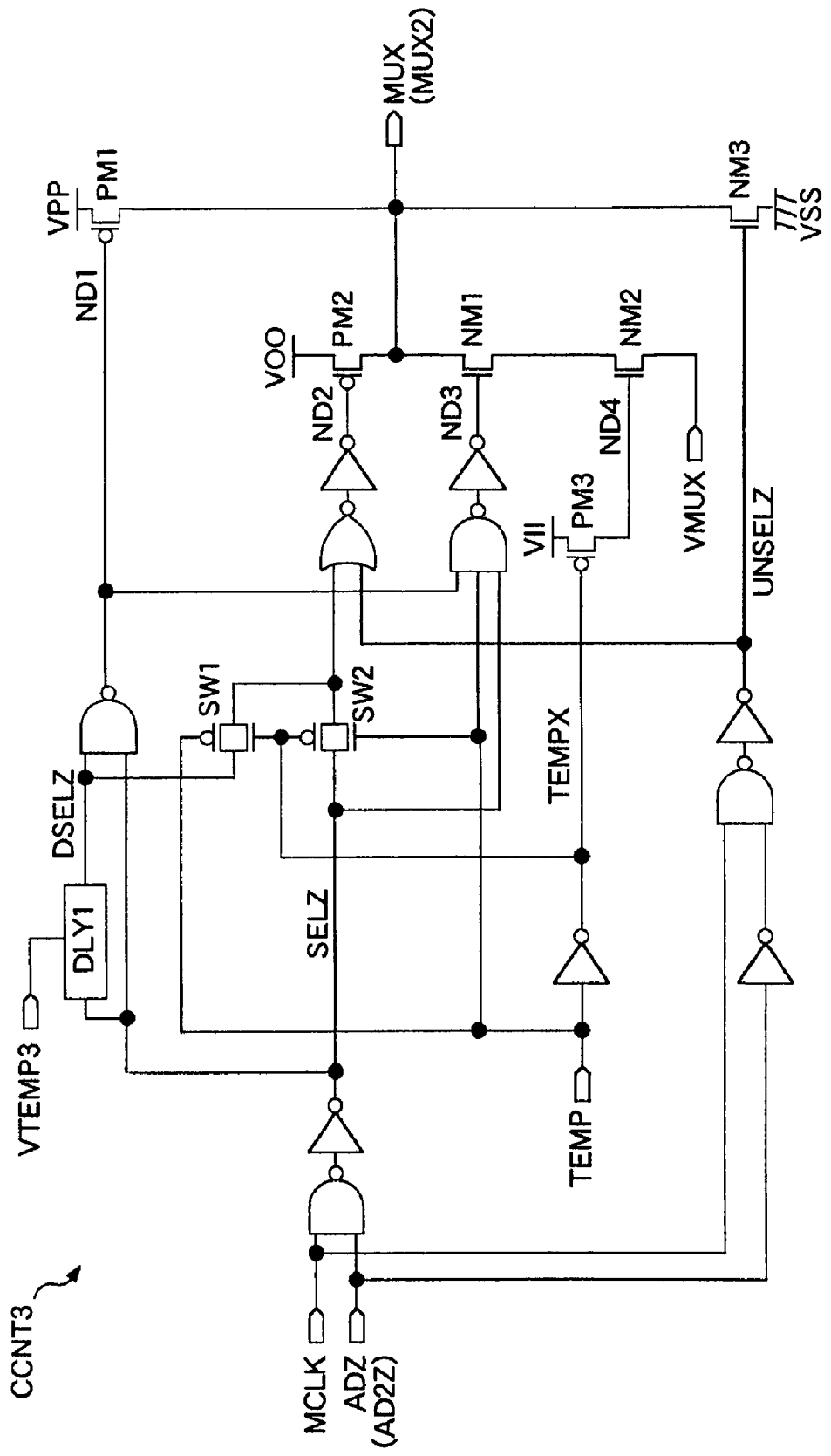
FIG. 27 illustrates an exemplary connection control circuit.

FIG. 27 illustrates an exemplary connection control circuit CCNT3 illustrated in FIG. 26. In the connection control circuit CCNT3, the power supply line of the delay circuit DLY1 is supplied with the sensed voltage VTEMP3. The other configuration of the connection control circuit CCNT3 is the same as or similar to the configuration of the connection control circuit CCNT illustrated in FIG. 4. The delay time of the delay circuit DLY1 elongates when the sensed voltage VTEMP3 is low, and is reduced when the sensed voltage VTEMP3 is high. The delay time of the delay circuit DLY1 indicates a low-level period of the switch control signal MUX during disconnection. The delay time of the delay circuit DLY1 indicates an off period (on-resistance) of the connection switch BT.

Figure 28:
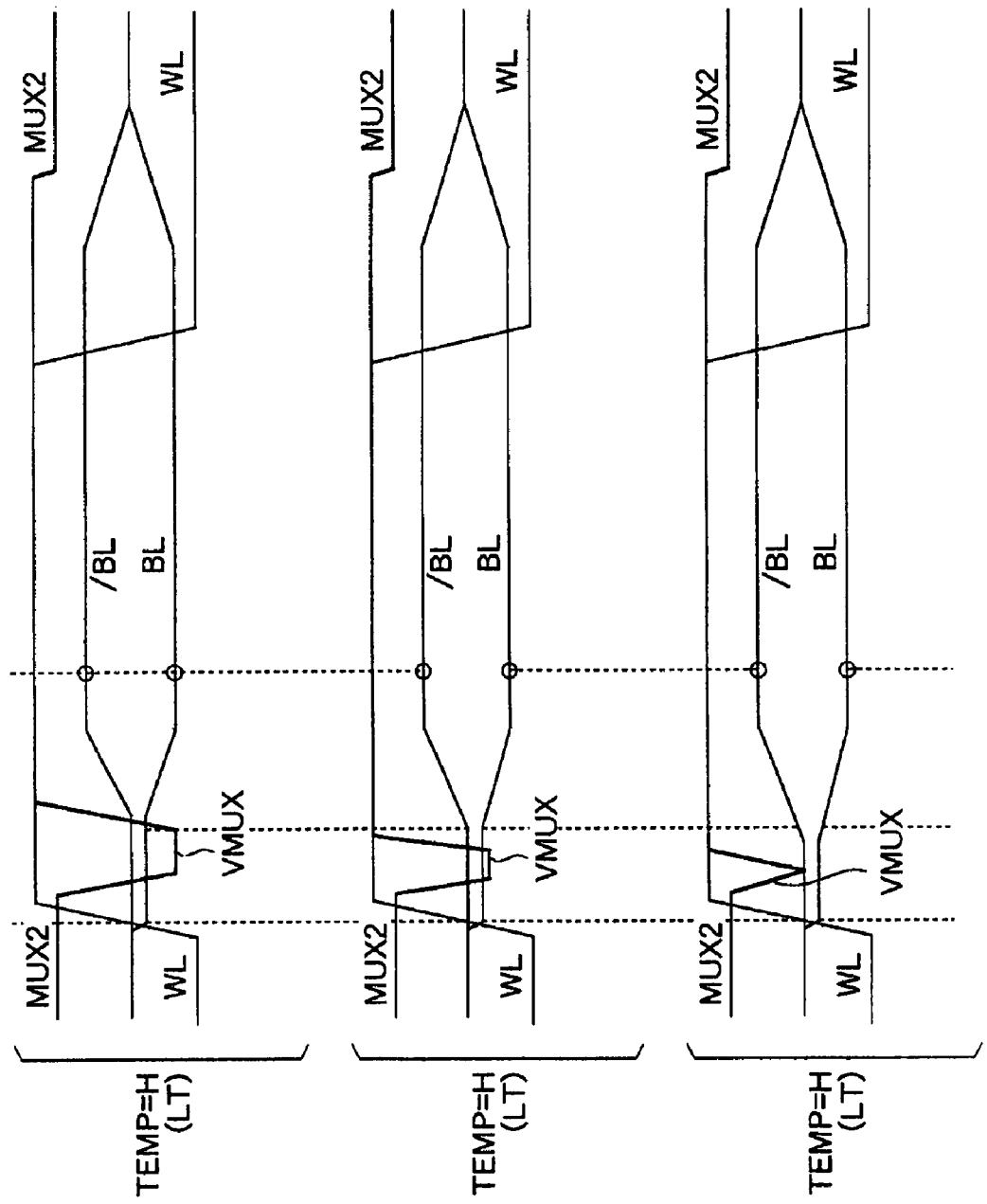
FIG. 28 illustrates an exemplary memory read operation in a low-temperature state.

FIG. 28 illustrates an exemplary read operation of the memory MEM illustrated in FIG. 26 in the low-temperature state LT. For example, the upper-side waveforms, middle waveforms and lower-side waveforms in FIG. 28 respectively indicate the cases when the temperature of the memory MEM is 0° C., 20° C. and 40° C. The waveforms when the temperature of the memory MEM is higher than or equal to 60° C. are the same as the waveforms of the high-temperature state HT illustrated in FIG. 11. As the temperature decreases, the off period of the connection switch BT elongates, and the on-resistance increases. Since the off-period of the connection switch BT, for example, the timing of disconnection is changed by adjusting the delay time of the delay circuit DLY1 depending on the temperature, the operation illustrated in FIG. 28 provides the similar advantageous effects to the operation illustrated in FIG. 22.

A plurality of delay circuits that have different delay times may be formed in the connection control circuit CCNT in place of the delay circuit DLY1. The timing of disconnection may be changed as in the case of FIG. 28 by switching the delay circuit to be used depending on the temperature of the memory MEM. One of the plurality of delay circuits is, for example, selected based on a digital value that is generated by A/D converting the sensed voltage VTEMP3. As in the case of FIG. 23, the temperature signal TEMP may be not output to the connection control circuit CCNT3, and the temperature signal terminal TEMP of the connection control circuit CCNT3 may be coupled to the power supply line VII. As in the case of FIG. 25, the switch control signal MUX, for example, the waveform of a pulse signal, is varied depending on a temperature.

The tenth embodiment provides the similar advantageous effects to those of the first to ninth embodiments. In the tenth embodiment, the timing of pulse of the switch control signal MUX is varied depending on a temperature. Therefore, at the time of disconnection, a decrease in timing margin of a read operation may be prevented.

Figure 29:
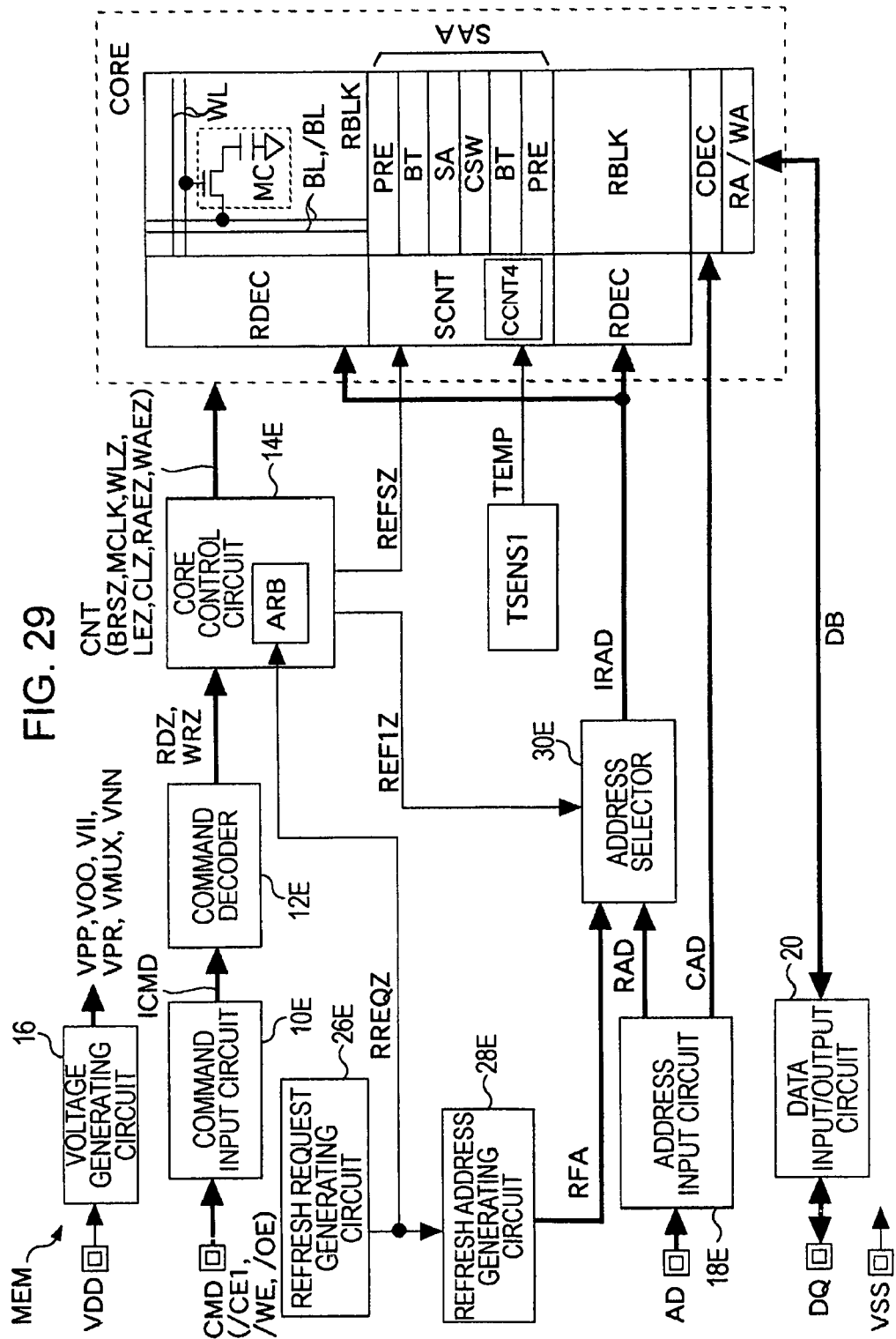
FIG. 29 illustrates an eleventh embodiment.

FIG. 29 illustrates an eleventh embodiment. For example, the semiconductor memory MEM is a pseudo-SRAM-type Fast Cycle RAM (FCRAM). The pseudo-SRAM includes a DRAM memory cell (dynamic memory cell) and an SRAM interface. The memory MEM may be a semiconductor memory enclosed in a package or may be a memory macro (IP) mounted on a system LSI, or the like. The memory MEM of the eleventh embodiment is of a clock asynchronous-type, and may be of a clock synchronous-type instead.

The memory MEM includes a command input circuit 10E, a command decoder 12E, a core control circuit 14E and an address input circuit 18E in place of the command input circuit 10, the command decoder 12, the core control circuit 14 and the address input circuit 18 illustrated in FIG. 1. The memory MEM further includes a refresh request generating circuit 26E, a refresh address generating circuit 28E and an address selector 30E. The connection control circuit CCNT4 of the memory MEM differs from the connection control circuit CCNT illustrated in FIG. 1. The other configuration of the memory MEM is the same as or similar to the configuration illustrated in FIG. 1.

The command input circuit 10E receives a chip enable signal /CE1, a write enable signal /WE and an output enable signal /OE as the command signals CMD. The command decoder 12E outputs a read command signal RDP for executing a read operation of the memory core CORE and a write command signal WRP for executing a write operation of the memory core CORE in accordance with the logic level of an internal command signal ICMD.

The core control circuit 14E outputs a control signal CNT for executing an access operation (read operation, write operation, or refresh operation) in accordance with the read command signal RDP, the write command signal WRP and a refresh request signal RREQZ (internal refresh command) to the memory core CORE. The core control circuit 14E includes an arbiter ARB that determines a priority when the external access command (the read command signal RDP or the write command signal WRP) conflicts with the internal refresh command REFPZ. The core control circuit 14E activates a read signal RDZ when a read operation is executed, activates a write signal WRZ when a write operation is executed, and activates a refresh signal REF1Z when a refresh operation is executed. The core control circuit 14E outputs a refresh cycle signal REFSZ when a refresh operation is inserted during access cycle.

The address input circuit 18E receives the row address signal RAD and the column address signal CAD with different address terminals AD contemporaneously. The memory MEM of the eleventh embodiment employs an address non-multiplex mode. The temperature sensing circuit TSENS1 may be formed outside of the memory MEM and, as in the case of FIG. 1, the temperature signal TEMP may be supplied to the memory MEM through an external terminal.

The refresh request generating circuit 26E periodically generates the refresh request signal RREQZ. The refresh address generating circuit 28E sequentially generates the refresh address signal RFA in synchronization with the refresh control signal REFPZ. The address selector 30E outputs the refresh address signal RFA as an internal row address signal IRAD when the refresh signal REF1Z is at a high level. The address selector 30E outputs an external row address signal RAD as the internal row address signal IRAD when the refresh signal REF1Z is at a low level.

Figure 30:
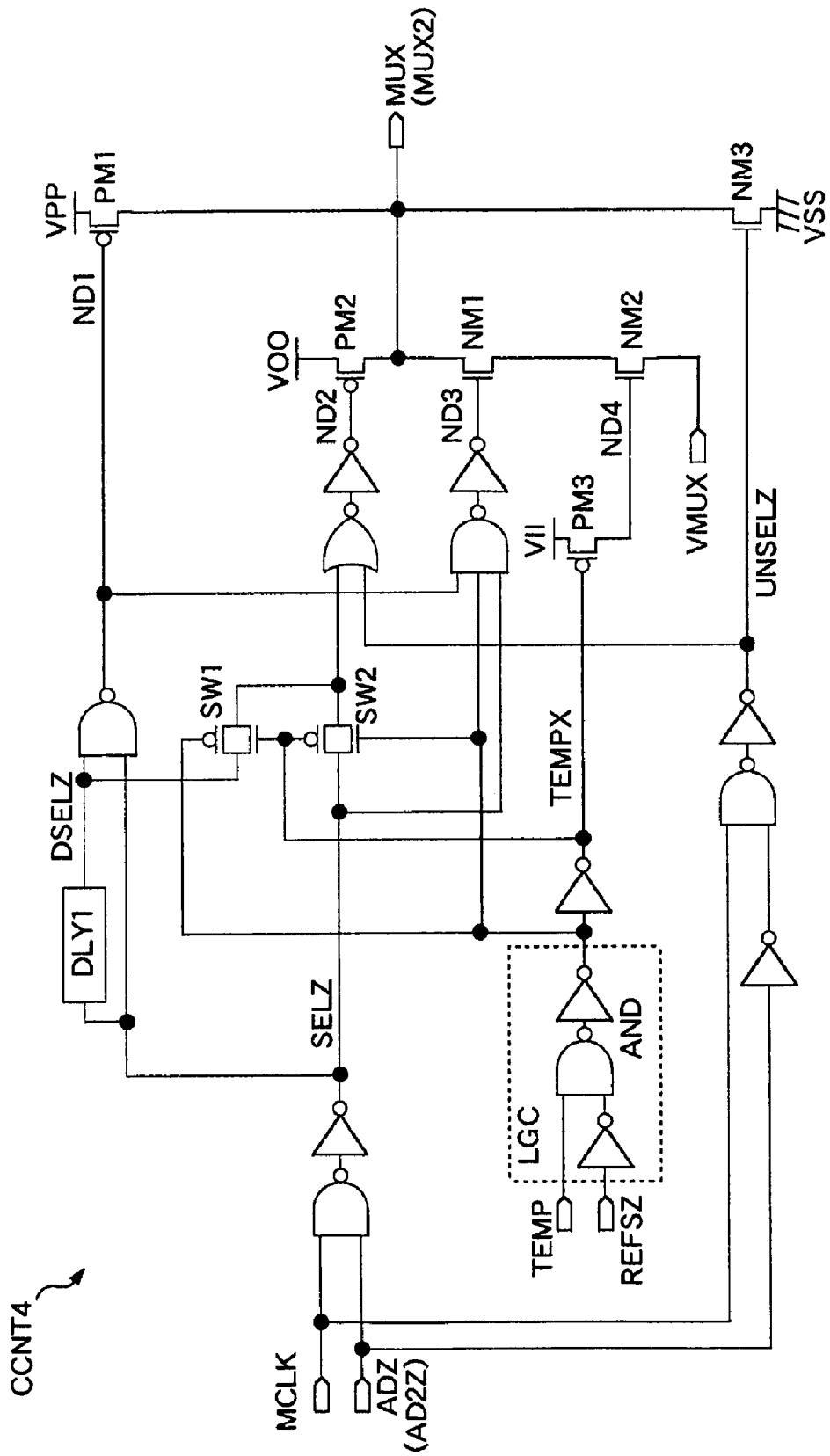
FIG. 30 illustrates an exemplary connection control circuit.

FIG. 30 illustrates an exemplary connection control circuit CCNT4 illustrated in FIG. 29. The connection control circuit CCNT4 includes a logic circuit LGC in the temperature signal terminal TEMP in FIG. 4. The logic circuit LGC receives the refresh cycle signal REFSZ. The other configuration of the connection control circuit CCNT4 is the same as or similar to the configuration of FIG. 4.

The logic circuit LGC includes an AND circuit, which receives the inverted logic of the refresh cycle signal REFSZ and the temperature signal TEMP, or a negative logic OR circuit. The temperature signal TEMPX for setting the switch control signal MUX to a low-level voltage VMUX is activated when the temperature signal TEMP is at a high level and the refresh cycle signal REFSZ is at a low level. In the eleventh embodiment, during access cycle in which a refresh operation is not inserted in the low-temperature state, the sense amplifier SA is disconnected from the bit lines BL and /BL. During access cycle in which a refresh operation is inserted, disconnection is not performed even when the temperature of the memory MEM is low. The arbiter ARB and the logic circuit LGC prohibit disconnection irrespective of the temperature of the memory MEM when the data read request conflicts with the refresh request.

Figure 31:
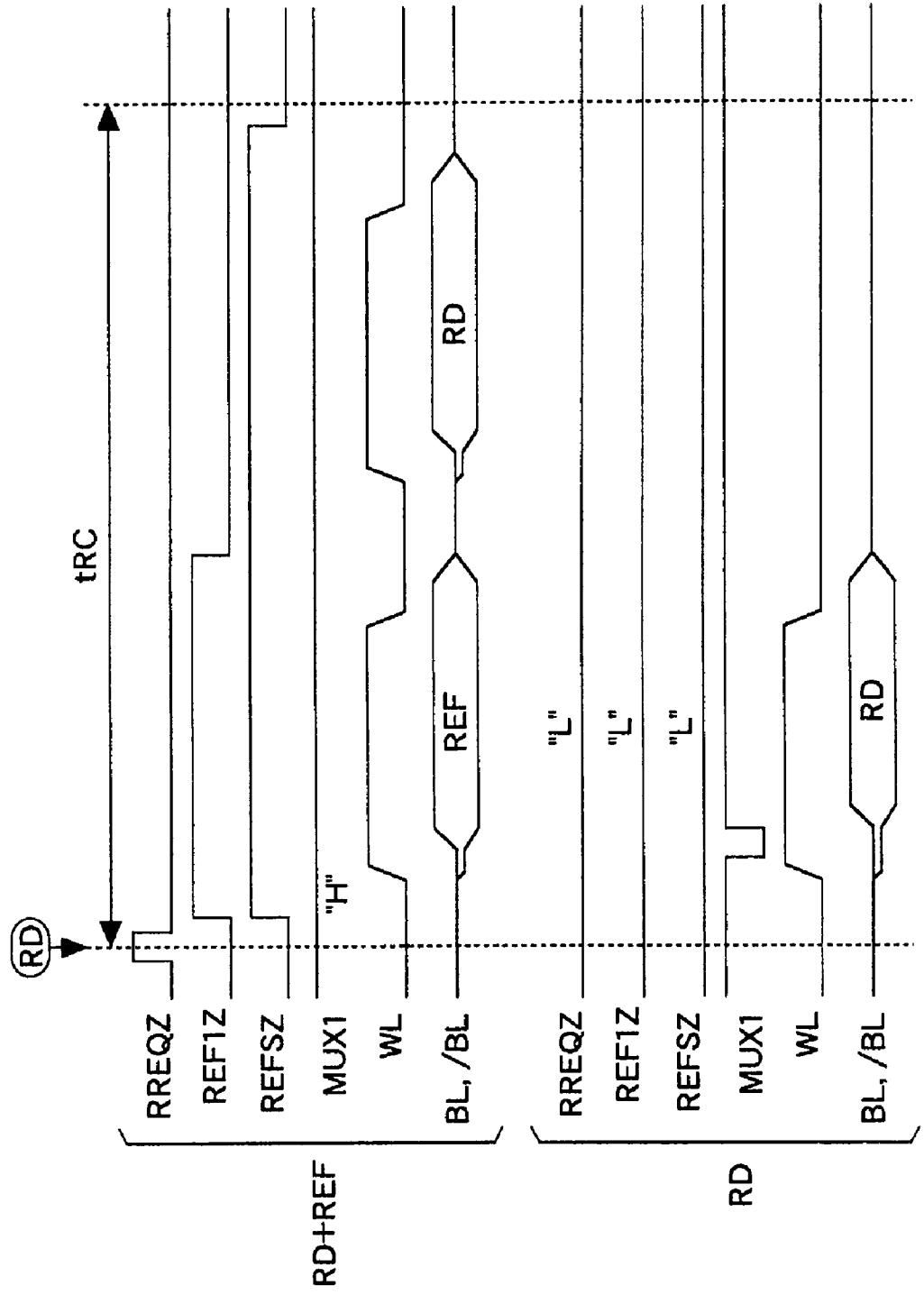
FIG. 31 illustrates an exemplary memory read operation in a low-temperature state.

FIG. 31 illustrates an exemplary read operation of the memory MEM illustrated in FIG. 29 in the low-temperature state LT. The upper-side waveforms in FIG. 31 indicate the case when the refresh operation REF is inserted. The lower-side waveforms in FIG. 31 indicate the case when the refresh operation REF is not inserted. When the data read request conflicts with the refresh request and the refresh operation REF is inserted during access cycle tRC, the memory MEM activates the word line WL twice during the access cycle tRC and executes the refresh operation REF and the read operation RD. The word line WL that executes the refresh operation REF is highly likely to differ from the word line WL that executes the read operation RD. Thus, the timing margin of the internal circuit is considerably small as compared with when the refresh operation REF is not inserted. By prohibiting disconnection when the timing margin is small, elongation of the access cycle tRC is prevented, and read access time is reduced. Although not shown in the drawing, in a write operation as well, elongation of the access cycle tRC is prevented, and write access time is reduced.

In the eleventh embodiment, when the refresh operation REF is inserted, disconnection is prohibited in both the refresh operation REF and the read operation RD. Since power supply noise, and the like, is relatively small and voltage variations in the bit lines BL and /BL are small in the refresh operation REF where the read amplifier RA and the data input/output circuit 20 do not operate, disconnection may be prohibited only in the refresh operation REF. When disconnection is prohibited only in the refresh operation REF, the logic circuit LGC illustrated in FIG. 30 is supplied with the refresh signal REF1Z in place of the refresh cycle signal REFSZ.

The eleventh embodiment provides the similar advantageous effects to those of the first to tenth embodiments. In the eleventh embodiment, disconnection is prohibited when the timing margin of the internal circuit is reduced because of insertion of the refresh operation. Thus, elongation of the access cycle tRC is prevented, and read access time and write access time are reduced.

Figure 32:
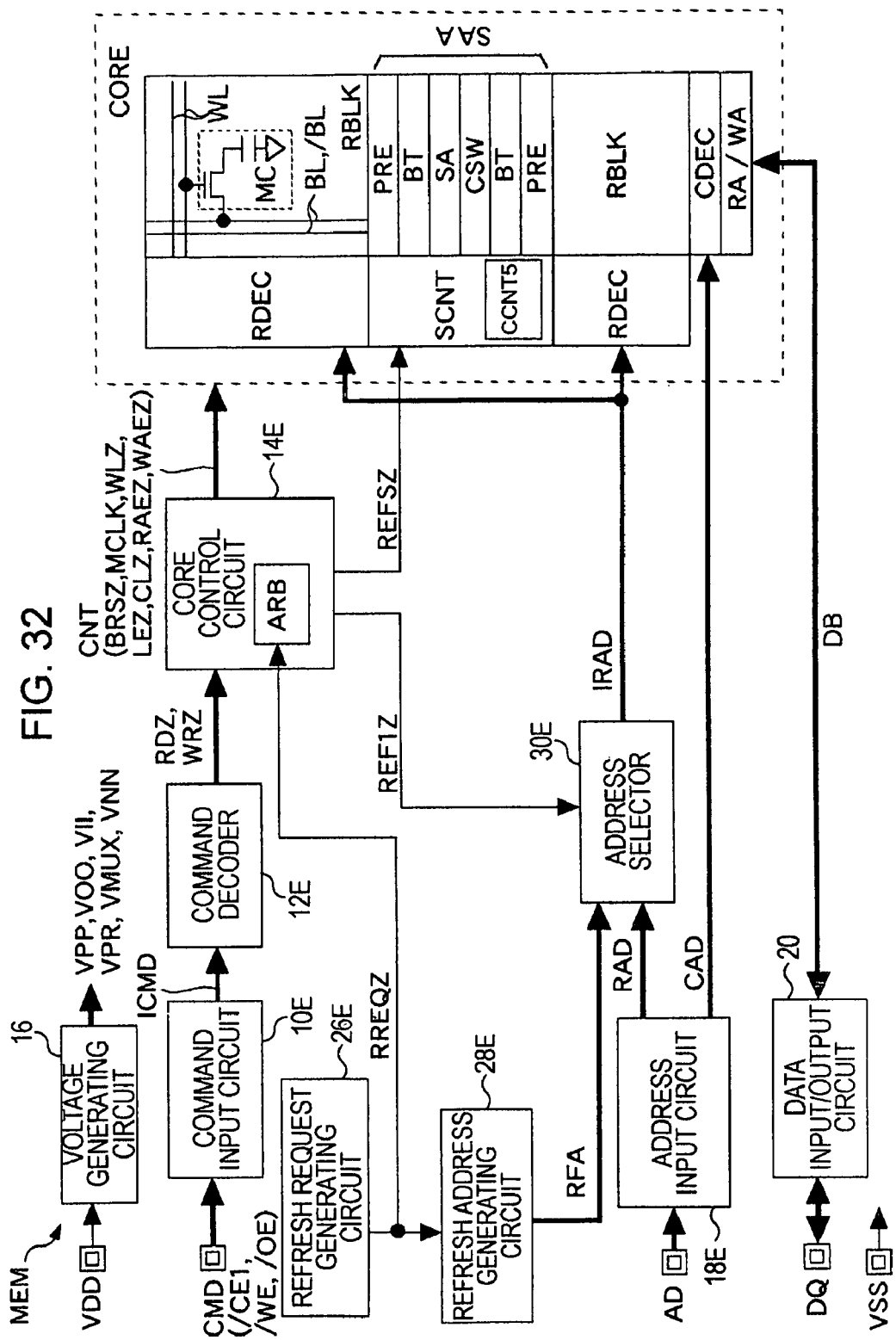
FIG. 32 illustrates a twelfth embodiment.

FIG. 32 illustrates a twelfth embodiment. In the twelfth embodiment, like reference numerals denote like elements to those of the first to eleventh embodiments, and the detailed description thereof is omitted. The memory MEM of the twelfth embodiment includes a configuration that the temperature sensing circuit TSENS1 is omitted from the memory MEM illustrated in FIG. 29. The connection control circuit CCNT5 differs from the connection control circuit CCNT4 illustrated in FIG. 29. The other configuration of the memory MEM of the twelfth embodiment is the same as or similar to the configuration of FIG. 29. The semiconductor memory MEM may be a pseudo-SRAM-type FCRAM.

Figure 33:
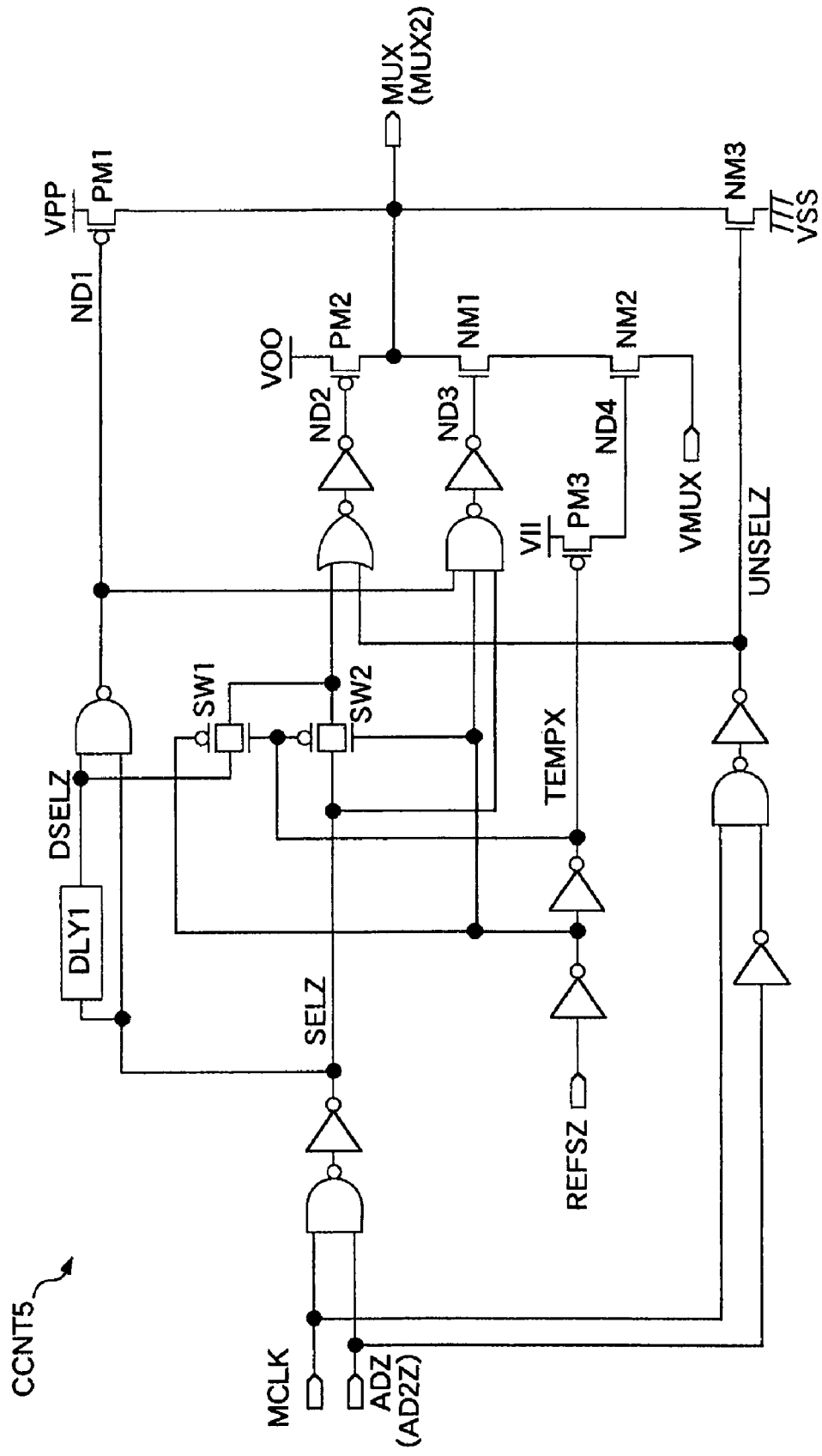
FIG. 33 illustrates an exemplary connection control circuit.

FIG. 33 illustrates an exemplary connection control circuit CCNT5 illustrates in FIG. 32. The connection control circuit CCNT5 receives the refresh cycle signal REFSZ in place of the temperature signal TEMP. The other configuration of the connection control circuit CCNT5 is the same as or similar to the configuration of the connection control circuit CCNT illustrated in FIG. 4.

In the twelfth embodiment, during access cycle where a refresh operation is inserted, disconnection is not performed irrespective of the temperature of the memory MEM. During access cycle where the refresh operation REF is not inserted, disconnection is also performed when the temperature of the memory MEM is high. The twelfth embodiment provides the similar advantageous effects to those of the first to eleventh embodiments.

The above described embodiments are applied to a DRAM or a pseudo-SRAM-type FCRAM. However, the embodiments may be applied to, for example, a semiconductor memory that employs a shared sense amplifier, such as an SRAM or a ferroelectric memory.

In the embodiments illustrated in FIG. 1 to FIG. 28, when the command input circuit, the command decoder, the core control circuit and the address input circuit are changed, and the refresh request generating circuit 26E, the refresh address generating circuit 28E and the address selector 30E are formed on the memory MEM, these embodiments may also be applied to a pseudo-SRAM-type FCRAM.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor memory device comprising:
a sense amplifier; and
a bit line,
wherein disconnection of the sense amplifier from the bit line is performed during a data read operation when the temperature in the semiconductor memory device is at a first temperature, and
wherein the disconnection of the sense amplifier from the bit line is not performed in the data read operation when the temperature in the semiconductor memory device is at a second temperature.

2. The semiconductor memory device according to claim 1, wherein determining whether disconnection of the sense amplifier is performed is based on a control signal.

3. The semiconductor memory device according to claim 2, wherein the control signal is supplied from an outside source.

4. The semiconductor memory device according to claim 2, wherein the control signal is generated based on fuse breakage information.

5. The semiconductor memory device according to claim 1, wherein the first temperature is lower than the second temperature.

6. A semiconductor memory device comprising:
a disconnection circuit that controls disconnection of a sense amplifier from a bit line in a data read operation;
a temperature sensing circuit that senses a temperature; and
a disconnection control circuit that controls disconnection by the disconnection circuit based on the temperature;
wherein, the sense amplifier is disconnected at a first temperature and is not disconnected at a second temperature.

7. The semiconductor memory device according to claim 6, wherein the disconnection control circuit determines whether the disconnection is performed based on at least one of a control signal from an outside source and a control signal from a programmed circuit.

8. The semiconductor memory device according to claim 6, wherein the disconnection circuit includes a transistor that is controlled based on a disconnection control signal from the disconnection control circuit.

9. The semiconductor memory device according to claim 6, further comprising, a disconnection prohibiting circuit that prohibits the disconnection irrespective of the temperature when a data read request conflicts with a refresh request.

10. The semiconductor memory device according to claim 6, wherein the temperature sensing circuit includes a trimming circuit that adjusts the temperature to be sensed.

11. The semiconductor memory device according to claim 10, further comprising,
a trimming control circuit that adjusts the trimming circuit based on an external control.

12. The semiconductor memory device according to claim 6, wherein the disconnection control circuit performs the disconnection when the temperature is lower than or equal to a certain temperature, and does not perform the disconnection when the temperature exceeds the certain temperature.

13. The semiconductor memory device according to claim 6, wherein the disconnection control circuit outputs a pulse signal for controlling the disconnection circuit, and changes waveform of the pulse signal based on the temperature.

14. A method of operating a semiconductor memory device, comprising:
activating a word line;
activating a disconnection control signal that disconnects a sense amplifier from a bit line when the temperature in the semiconductor memory device is a first temperature; and
prohibiting activation of the disconnection control signal that disconnects the sense amplifier from the bit line when the temperature in the semiconductor memory device is a second temperature.

15. The method according to claim 14, further comprising detecting one of the first temperature and the second temperature.

16. The method according to claim 14, wherein the first temperature is lower than the second temperature.

17. The method according to claim 14, further comprising, adjusting a timing of the disconnection based on one of the first temperature and the second temperature.

18. The method according to claim 14, further comprising: prohibiting the disconnection irrespective of the temperature when an access request that requests activation of the word line conflicts with a refresh request.

19. A memory system comprising:
a CPU; and
a semiconductor memory device that disconnects a sense amplifier from a bit line in a data read operation based on an instruction from the CPU,
wherein the disconnection of the sense amplifier from the bit line is performed when the temperature in the semiconductor memory device is a first temperature, and the disconnection of the sense amplifier from the bit line is not performed when the temperature in the semiconductor memory device is a second temperature.

20. A memory system according to claim 19, wherein the semiconductor memory comprises:
a disconnection circuit that disconnects the sense amplifier from the bit line;
a temperature sensing circuit that senses the temperature; and
a disconnection control circuit that controls execution or prohibition of the disconnection by the disconnection circuit based on the temperature.

* * * * *